United States Patent
Notten et al.

[11] Patent Number: 6,016,047
[45] Date of Patent: Jan. 18, 2000

[54] BATTERY MANAGEMENT SYSTEM AND BATTERY SIMULATOR

[75] Inventors: Petrus H.L. Notten; Hendrik J. Bergveld; Wanda S. Kruijt, all of Eindhoven, Netherlands

[73] Assignee: U.S. Philips Corporation, New York, N.Y.

[21] Appl. No.: 08/968,376

[22] Filed: Nov. 12, 1997

[30] Foreign Application Priority Data

Nov. 21, 1996 [EP] European Pat. Off. .............. 96203228

[51] Int. Cl.⁷ ...................................................... H02J 7/00
[52] U.S. Cl. ........................................... 320/137; 320/128
[58] Field of Search ........................... 320/137, 150–153, 320/156, 147

[56] References Cited

U.S. PATENT DOCUMENTS

| | | | |
|---|---|---|---|
| 4,782,279 | 11/1988 | Selanger | 320/147 |
| 4,952,861 | 8/1990 | Horn | 320/133 |
| 5,166,596 | 11/1992 | Goedken | 320/150 |
| 5,206,578 | 4/1993 | Nor | 320/118 |
| 5,717,313 | 2/1998 | Grabon | 320/150 |
| 5,850,134 | 12/1998 | Oh et al. | 320/106 |

FOREIGN PATENT DOCUMENTS 9001578  2/1992  Netherlands .

*Primary Examiner*—Peter S. Wong
*Assistant Examiner*—Lawrence Luk
*Attorney, Agent, or Firm*—Brian J. Wieghaus

[57] ABSTRACT

A battery management system 100 comprises input means 102 for receiving input signals, such as current or voltage, which represent a physical quantity of a battery. In operation, processing means 105 of the battery management system 100 calculate a physical quantity of the battery, such as the State of Charge, based on the input signals by using an electrochemical/physical model of the battery. The model includes a representation of a main electrochemical storage reaction, whose behaviour is calculated in dependence on a battery temperature. The processing means 105 calculates the battery temperature based on a temperature model of a temperature development in the battery. The battery management system 100 comprises output means 104 for outputting an output signal which is derived from a state of the electrochemical storage reaction. The battery management system 100 is, advantageously, used in a smart battery 10 or a battery charger/discharger 200. The model is, advantageously, also used in a battery simulator.

15 Claims, 12 Drawing Sheets

BATTERY MANAGEMENT SYSTEM AND BATTERY SIMULATOR

BACKGROUND OF THE INVENTION

The invention relates to a battery management system comprising input means for receiving input signals representative of a physical quantity of a battery and processing means for calculating at least one physical quantity of the battery at least partially based on the input signals and a battery temperature; and for generating an output signal derived from the calculated physical quantity. The invention also relates to a smart battery comprising a battery management system. The invention further relates to a battery charger/discharger comprising a battery management system.

The invention also relates to a battery simulator comprising: input means for receiving an input value of at least one parameter representative of a physical quantity of a battery; and processing means for calculating at least one characteristic of a physical quantity of the battery at least partially based on the input value and a battery temperature; and for generating an output characteristic derived from the calculated characteristic of the physical quantity. The invention further relates to a method for simulating a behaviour of a battery; the method comprising receiving an input value of at least one parameter representative of a physical quantity of the battery; calculating at least one characteristic of a physical quantity of the battery at least partially based on the input value and a battery temperature; and generating an output characteristic derived from the calculated characteristic of the physical quantity.

The invention further relates to a method for producing a battery, comprising simulating a characteristic of the battery, and producing the battery according to the generated output characteristics.

The application of rechargeable batteries and, particularly, of sealed rechargeable batteries in portable electronic products is rapidly growing. Important application areas are portable computers (notebooks, PDAs, game computers, etc.), mobile phones, portable audio equipment, camcorders and various other cordless products, such as shavers, vacuum cleaners, or screw-drivers. From a consumer's point of view a longer playing time and a longer life-time of battery driven products are key factors in determining their attractive power. For many products it is important that the consumer is informed of the actual State of Charge (SoC) of the battery. This is particularly the case for devices, such as mobile phones or camcorders, which may be used outside the reach of power supplies, allowing the user to determine whether the battery needs to be recharged while the user still has access to a power supply. Increasingly Battery Management Systems (BMSs) are used for, depending on the application, realising fast and efficient battery charging, allowing exploitation of a substantial part of the available battery capacity, or providing information, such as the state of charge, to the user. The battery management system may be integrated with the battery (forming a so-called smart-battery), added to a battery in a fixed smart battery pack, used in a quick-charger, or implemented in a consumer product. It will be understood that the term battery relates not only to a single battery cell but also to a group of batteries used in series or parallel, or a combination of both.

The patent application NL 9001578 describes a battery management system wherein an input signal, which represents a physical quantity of the battery, such as battery voltage, charge or discharge current and battery temperature, is sampled regularly, for instance every second. The battery management system uses a model, describing the physical behaviour of the battery, to generate as the output signal an indication of the State of Charge based on the present and historic measurements. After each new measurement the previous State of Charge value is updated by subtracting the discharge current ($I_d$) for the sampling period and adding the charge current ($I_c$) for the sampling period multiplied by a charge efficiency parameter ETA ($SoC_n = SoC_{n-1} - I_d/3600 + ETA*I_c/3600$, where the SoC is given in Ah). Also an accumulated charge and discharge current are calculated. Whenever a predetermined "full" or "empty" charge state is reached, the accumulated measurements are used to readjust the charge efficiency parameter. The model is programmed in software and executed by a processor. The known system is limited to indicating the State of Charge. The system uses a physical model, which uses the charge and discharge current as input. No use of other inputs for determining the State of Charge is described. The accuracy of the system is limited, particularly when the predetermined "full" or "empty" charge states are not frequently reached.

SUMMARY OF THE INVENTION

It is an object of the invention to provide a battery management system of the kind set forth which supplies more reliable information, such as State of Charge, with respect to a condition of the battery. It is a further object to provide a battery management system of the kind set forth which can be used for controlling fast and efficient charging of a battery. It is a further object to provide a battery management system of the kind set forth which can be used for controlling charging or discharging of a battery in such a way that the available battery capacity can be exploited efficiently.

A battery management system according to the invention is characterised in that the processing means is conceived to: calculate the physical quantity based on an electrochemical/physical model of the battery; the model including at least one representation of a main electrochemical storage reaction; calculate the battery temperature based on a temperature model of a temperature development in the battery and to calculate the behaviour of the representation in dependence on the calculated battery temperature; and derive the output signal at least partially from a state of the representation.

The inventors had the insight that, in order to produce a better and more reliable information signal from the input signals, the actual behaviour of the battery needed to be modelled more accurately, particularly by modelling the main electrochemical storage reaction. In order to make the battery management system also suited for controlling charging or discharging of a battery, the inventors realised that existing battery management systems, capable of doing this, typically deal with a conservative operating range of the battery, avoiding unclear and more dynamic (and potentially dangerous) behaviour and that, as a result, it may not be possible to fully exploit the potentially available battery capacity and that the time needed to charge a battery to a desired charge level may be longer than required. The inventors had the insight that the physical and electrochemical processes in the battery are to a high extent influenced by the battery temperature and that, therefore, a model of the temperature development was required in order to be able to better determine the state of the battery. By incorporating the temperature dependency in the electrochemical model the behaviour of the battery can be controlled and/or predicted under a wider operating range.

It should be noted that, instead of using a model for implementing the battery knowledge, it is also known to use a table, which is indexed using one or more battery parameters (e.g. charge/discharge current) to produce the required control signal. Usually the table is derived from experiments with known batteries. Furthermore, it is also known to use a neural network which has been trained with measurements of known batteries. Based on the supplied battery parameters the neural network produces the required control signal. Both of these approaches can only be guaranteed to operate with a reasonably high accuracy under known and relatively stable circumstances. These approaches, therefore, are not suited for handling more 'dynamic' situations such as overcharging, overdischarging or rapidly fluctuating ambient temperature (e.g. placing a battery pack from a charger with a high temperature of e.g. 60° C. into a car of −10° C.). Even if the table contained data for the entire operating range of e.g. −10° C. to 60° C., relaxation of the battery (which is not described in the table but handled separately) would be different due to the temperature jump. Usually the allowed temperature range is also very restricted and temperatures outside this restricted temperature range can not be handled. By explicitly modelling the temperature behaviour of the battery and the influence of the battery on the electrochemical storage reaction, the system according to the invention is better suited for dealing with such dynamic situations.

It should also be noted that some existing battery management systems in addition to the current or voltage use the battery temperature as an input. The measured battery temperature is used to correct the SoC prediction based on the present temperature or to terminate the charging process when a too high temperature is reached, a defined temperature difference with an ambient temperature is reached or when a defined change in temperature occurs.

In a further embodiment according to the invention, the battery management system is characterised in that the battery temperature is modelled as depending on an internal heat flow generated in the battery, where the internal heat flow depends on at least one of: an entropy change of the main electrochemical storage reaction inside the battery, a power loss through charge transfer resistance in an electrochemical reaction, and power loss through internal ohmic resistance of an electrode and/or electrolyte. By modelling the internal heat flow, the accuracy of the calculation of the battery temperature is increased and, therefore, of the entire battery management system. Particularly, during charging the battery temperature may change significantly due to the internal heat flow. By, for instance, calculating the state of charge of the battery based on an accurate estimate of the battery temperature, the accuracy of the output of the battery management system is significantly increased.

In a further embodiment according to the invention, the battery management system is characterised in that the input means comprises an input for receiving a signal representative of an ambient temperature and in that the battery temperature is modelled as depending on an heat flow between the battery and an environment of the battery. Particularly in situations where the ambient temperature may change significantly, it is advantageous to incorporate the actual ambient temperature in the calculation of the battery temperature. It will be appreciated that the ambient temperature may change by placing the battery in an environment with a different temperature. Particularly when the battery and battery management system are embedded in a consumer product the ambient temperature may also rise due to use of the product and, specifically for small products, due to heat generated by a transformer and associated electronics during charging. By incorporating these considerable changes in temperature into the model, particularly the accuracy of the state of charge prediction can increase significantly.

In a further embodiment according to the invention, the battery management system is characterised in that at least one electrode comprises an overdischarge reserve; in that the model includes a second representation for an electrochemical side reaction involving the overdischarge reserve; and in that the processing means is conceived to calculate a state of the second representation in dependence on the calculated battery temperature and to derive the control signal at least partially from a state of the second representation. By incorporating the electrochemical side reaction involving the overdischarge reserve into the model, the accuracy of the model improves even further and, therefore, the accuracy of the output signal.

In a further embodiment according to the invention, the battery management system is characterised in that the battery temperature is modelled as depending on an entropy change of the electrochemical side reaction involving the overdischarge reserve. Advantageously, also the influence of the electrochemical side reaction involving the overdischarge reserve on the battery temperature (and, therefore, also on the main electrochemical storage reaction and the output signal) is incorporated.

In a further embodiment according to the invention, the battery management system is characterised in that the battery is of a sealed type; in that the model includes a third representation for an electrochemical side reaction involving gas; and in that the processing means is conceived to calculate a state of the third representation in dependence on the calculated battery temperature and to derive the output signal at least partially from a state of the third representation. Particularly during overcharging or overdischarging of aqueous battery systems, the electrochemical side reaction involving gas influences the main electrochemical storage reaction. Incorporating this effect enables increasing the accuracy of the output signal.

In a further embodiment according to the invention, the battery management system is characterised in that the battery temperature is modelled as depending on an entropy change of the electrochemical side reaction involving gas. Advantageously, also the influence of the electrochemical side reaction involving gas on the battery temperature (and, therefore, also on the main electrochemical storage reaction and the output signal) is incorporated.

In a further embodiment according to the invention, the battery management system is characterised in that the processing means is conceived to calculate a battery pressure based on a pressure model of a pressure development in the battery for the received input signals and to calculate the behaviour of the third representation in dependence on the calculated battery pressure. Particularly as a result of gas development, pressure may build-up, influencing the gas side reaction. Incorporating this effect enables increasing the accuracy of the output signal.

In a further embodiment according to the invention, the battery management system is characterised in that the model includes a fourth representation for modelling ion transport in an electrode and/or electrolyte; and in that the processing means is conceived to calculate a state of the fourth representation and an influence of the fourth representation on the first and/or second representation. By modelling the ion transport, such as the transport of protons for a NiCd battery, the kinetics of the reactions in the battery are modelled better. Incorporating this effect enables increasing the accuracy of the output signal.

In a further embodiment of the battery management system according to the invention, wherein the control signal controls at least a battery charger, the battery management system is characterised in that the processing means is conceived to control the charging of the battery by maintaining a battery temperature substantially at a predetermined temperature curve. The temperature highly determines the behaviour of the battery. Advantageously, a charging scheme used by the battery charger controls the battery temperature according to a desired temperature curve, allowing faster or more fully charging of the battery.

It is a further object of the invention to provide a smart battery of the kind set forth which supplies more reliable information, such as State of Charge, with respect to a condition of the battery. It is a further object to provide a smart battery of the kind set forth which can be charged fast and efficiently. It is a further object to provide a smart battery of the kind set forth which can be charged and/or discharged in such a way that the available battery capacity can be exploited efficiently. This object is achieved by the smart battery comprising a battery; measuring means for measuring at least one physical quantity of the battery; a battery management system, wherein the measuring means is connected to the input means of the battery management system; and information/control means for presenting information with respect to physical quantity of the battery and/or controlling charging/discharging of the battery in response to the output signal of the battery management system, where for the battery management system one of above described battery management systems is used.

It is a further object of the invention to provide a battery charger/discharger of the kind set forth which supplies more reliable information, such as State of Charge, with respect to a condition of the battery. It is a further object to provide a battery charger/discharger of the kind set forth which can be used for fast and efficient charging of a battery. It is a further object to provide a battery charger/discharger of the kind set forth which can be used for charging or discharging of a battery in such a way that the available battery capacity can be exploited efficiently. This object is achieved by the battery charger/discharger comprising measuring means for measuring at least one physical quantity of a battery; a battery management system, wherein the measuring means is connected to the input means of the battery management system; and control means for controlling charging and/or discharging of the battery in response to the output signal of the battery management system, where for the battery management system one of above described battery management systems is used.

It is desired to provide batteries for equipment, such as portable or cordless products, which give a long playing time and/or have a long life-time. To this end, increasingly application-specific batteries are developed for such equipment, for instance considering average and peak power requirements of the equipment and energy requirements for the equipment. It is known to use a battery simulator to simulate characteristics of the battery, based on input parameters which represent a physical quantity of a battery. By adjusting the input parameters, it can be checked whether a battery design based on the design input parameters provides the required result. An example of a design parameter which can be chosen is the particle size of the electrode material, which in turn contributes to the surface area of the electrode and, as such, influences the charge transfer kinetics. If the simulation shows that the calculated characteristic(s) meet a predetermined criterion (e.g. the supplied current is sufficient for a given duration of stand-by power consumption and full power consumption), the battery is produced based on the design parameters which gave the desired result. In practice, however, the simulated results do not always sufficiently accurately match the observed real behaviour of the battery.

It is a further object of the invention to provide a battery simulator of the kind set forth whose simulation results better match the real behaviour of a battery. It is a further object to provide a method for simulating a battery leading to simulation results which better match the real behaviour of a battery. It is a further object of the invention to provide a method for producing a battery in which a characteristic of the battery better matches a predetermined criterion.

To meet the object of the invention, the battery simulator is characterised in that the processing means is conceived to calculate the battery temperature based on a temperature model of a temperature development in the battery; calculate the characteristic of the physical quantity based on an electrochemical/physical model of the battery; the model including at least one representation of a main electrochemical storage reaction, whose behaviour depends on the calculated battery temperature; and derive the output characteristic at least partially from a state of the representation of the main electrochemical storage reaction.

To meet the object of the invention, the method for simulating a behaviour of a battery is characterised in that the method comprises: calculating the battery temperature based on a temperature model of a temperature development in the battery; calculating the characteristic of the physical quantity based on an elertrochemical/physical model of the battery; the model including at least one representation of a main electrochemical storage reaction whose behaviour depends on the calculated battery temperature; and deriving the output characteristic at least partially from a state of the representation of the main electrochemical storage reaction.

To meet the object of the invention, the method for producing a battery, comprises: simulating a characteristic of the battery, by iteratively: selecting a value for at least one parameter representative of a physical quantity of the battery; calculating at least one characteristic of a physical quantity of the battery at least partially based on the parameter value and a battery temperature, by: calculating the battery temperature based on a temperature model of a temperature development in the battery; and calculating the characteristic of the physical quantity of the battery based on an electrochemical/physical model of the battery; the model including at least one representation of a main electrochemical storage reaction whose behaviour depends on the calculated battery temperature; the calculated characteristic at least partially being derived from a state of the representation of the main electrochemical storage reaction;

until the calculated characteristic meets a predetermined criterion; and producing the battery from battery materials by selecting and/or adapting a chemical composition and/or physical characteristic of the battery materials according to the parameters values last selected in the iteration.

The selected parameter values may directly or indirectly determine aspects such as the particle size of the electrode material (used for selecting or pre-processing the raw electrode material), the composition of the electrochemically active species of the electrodes involved in the energy storage reaction, whether and the extent in which use is made of other battery materials (such as resistance lowering materials), or whether surface depositing of other metals or materials on the electrode takes place.

BRIEF DESCRIPTION OF THE DRAWINGS

These and other aspects of the invention will be apparent from and elucidated with reference to the embodiments shown in the drawings.

DETAILED DESCRIPTION OF THE PREFERRED EMBODIMENTS

Figure 1:
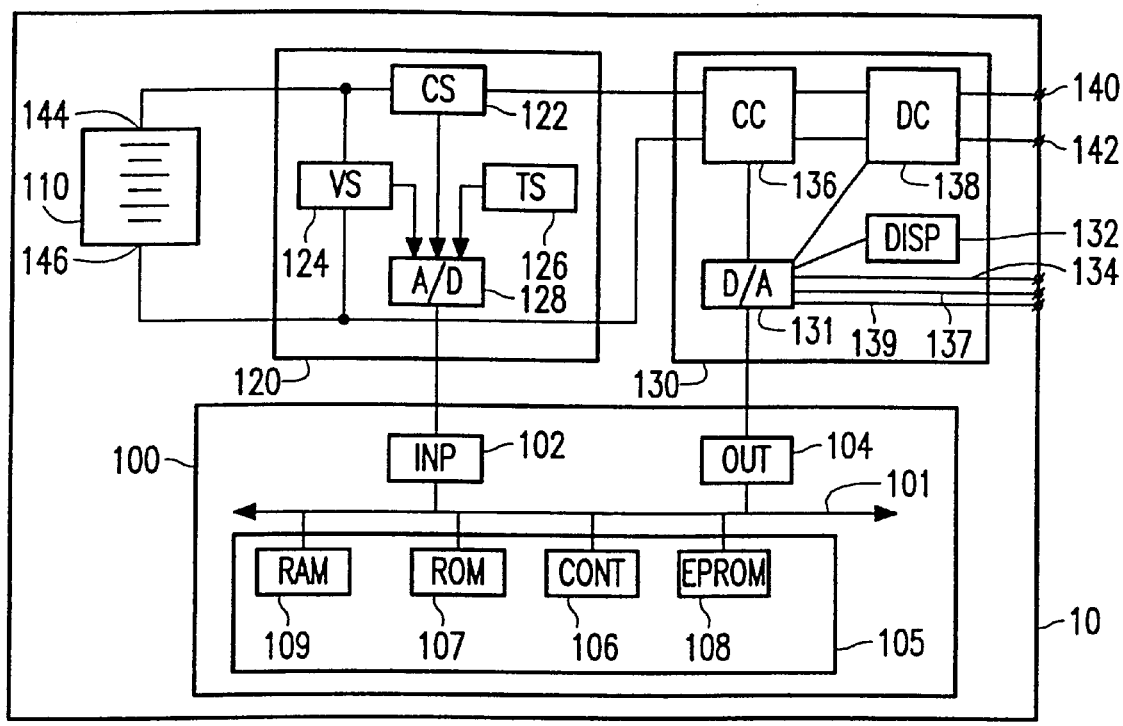
FIG. 1 shows a block diagram of a smart battery incorporating the battery management system according to the invention.

FIG. 1 illustrates a block diagram of the battery management system 100 according to the invention. As an example, the battery management system 100 is integrated with a battery 110, measuring means 120 and information/control means 130, forming a smart battery 10. The smart battery 10 comprises at least two terminals 140, 142 for supply/reception of power. Typically, the power is DC. If required also means for converting AC to DC, and/or vice versa, may be included allowing for the supply/reception of AC power. The measuring means 120 are used to measure at least one physical quantity of the battery. As an example, the measuring means 120 of FIG. 1 comprises a current measurer 122, a voltage measurer 124 and a temperature measurer 126. In itself such measurement means are known. As an example, the current measurer 122 may be implemented by including a low resistance device, such as for example a 0.1 ohm resistor, in one of the path from the terminals 140 and 142 to corresponding poles 144 and 146 of the battery 110 and monitoring the voltage across the resistance device. Alternatively, a current sensing MOSFET may be used for the current measurer 122. The voltage measurer 124 may be implemented by comparing the voltage between the poles 144 and 146 of the battery 110. The temperature measurer 126 may be implemented using a temperature sensor, which may be formed using a temperature sensitive resistor. The temperature measurer 126 may be used to measure the temperature of the battery 110 by positioning a temperature sensitive part of the temperature measurer 126 close to the battery 110 (e.g. on a seal of the battery), or integrating the temperature sensitive part of the temperature measurer 126 with the battery 110. This allows the battery management system 100 to compare the measured battery temperature against the battery temperature calculated by the battery management system 100 and adapt the model to the measured temperature. Advantageously, the temperature measurer 126 measures the ambient temperature, in which case, preferably, the temperature sensitive part of the temperature measurer 126 is located such that primarily the ambient temperature is measured instead of the battery temperature. It may be required to locate the temperature sensitive part of the temperature measurer 126 on the outside of a pack of the smart battery or even further removed from the pack. It will be appreciated that the measuring means 120 may comprise a temperature sensor for sensing the battery temperature as well as a temperature sensor for sensing the ambient temperature. The measuring means 120 provides the measured signals to input means 102 of the battery management system 100. Typically, the measured signals will be analogue, whereas the battery management system 100 processes digital signals. To perform the required conversion, an A/D converter 128 may be included in the measuring means 120, or alternatively in the input means 102 of the battery management system 100.

The information/control means 130 may be used for presenting information with respect to a physical quantity of the battery. The information, such as a State of Charge, may be presented to a user, for instance using a display 132, such as an LCD, or supplied as an information signal 134 to a device which incorporates the smart battery 10. Alternatively or additionally, the information/control means 130 may be used for controlling charging and/or/discharging of the battery. To this end, the information/control means 130 may comprise a charging controller 136 and/or a respective discharging controller 138. The charging controller 136 may be implemented in a conventional manner, for instance using a controllable switch, such as a transistor or MOSFET, to terminate the charging. The charging controller 136 may also provide a charge control signal 137 to the device which incorporates the smart battery 10, allowing the device to control the charging. The discharge controller 138 may use conventional logic to influence the discharging, e.g. by influencing a controllable voltage or current regulator. Preferably, the discharge controller 138 provides a discharge control signal 139 to the device which incorporates the smart battery 10. In response the device, such as a portable computer, may perform a predetermined shut-down procedure (such as saving critical data) or limit the power consumption. The information/control means 130 receives an output signal from output means 104 of the battery management system 100. Typically, the information/control means 130 produces an analogue information or control signal. The information/control means 130 may comprise a D/A converter 131 for performing the required D/A conversion. Alternatively, the output means 104 of the battery management system 100 may comprise a D/A converter.

The battery management system 100 comprises processing means 105. The processing means 105 may be implemented using combinatorial logic. Preferably, the processing means 105 is implemented using a programmable controller/microprocessor 106. The programmable controller/microprocessor 106 may be based on a conventional CISC or RISC type of controller or microprocessor, such as usually used for embedded applications. The controller 106 operates under control of a program stored in a program memory 107, such as ROM. The controller 106 may use a non-volatile data memory 108 for storing parameters of a more permanent nature, such as parameters of the model executed on the controller 106. Fixed parameters may be stored in ROM. Parameters, which may change over time, such as ageing sensitive parameters may be stored in EPROM or EEPROM. The controller 106 may also use a volatile data memory 109, such as RAM or registers, for temporarily storing data. The battery management system 100 may use a bus 101 for coupling the input means 102, output means 104 to the processing means 105. Advantageously, the bus 101 is also used for coupling the components of the processing means 105, such as the controller 106, the program memory 107, the non-volatile data memory 108, and the volatile data memory 109. Advantageously, the processing means 105, the input means 102 and output means 104 are integrated in one component, such as a single-chip micro-controller.

Advantageously, the battery management system 100 comprises means for adapting the model used by the battery management system 100. For instance, conventional techniques may be used to adapt parameters used by the model in such a way that one or more calculated physical quantities of the battery closer correspond to measured physical quantities of the battery. The adapting means may in this way be used to achieve that tolerances in the production process, such as small differences in the quantities of the species, which result in the behaviour of specific batteries deviating from the behaviour of a standard battery are corrected by adapting the model for the standard battery to a specific model for the specific battery for which the model is used at that instance. Preferably, the adaption means is used continuously or repeatedly during the life-time of the battery to adapt the model, catering for battery degradation during the life-time of the battery.

Figure 2:
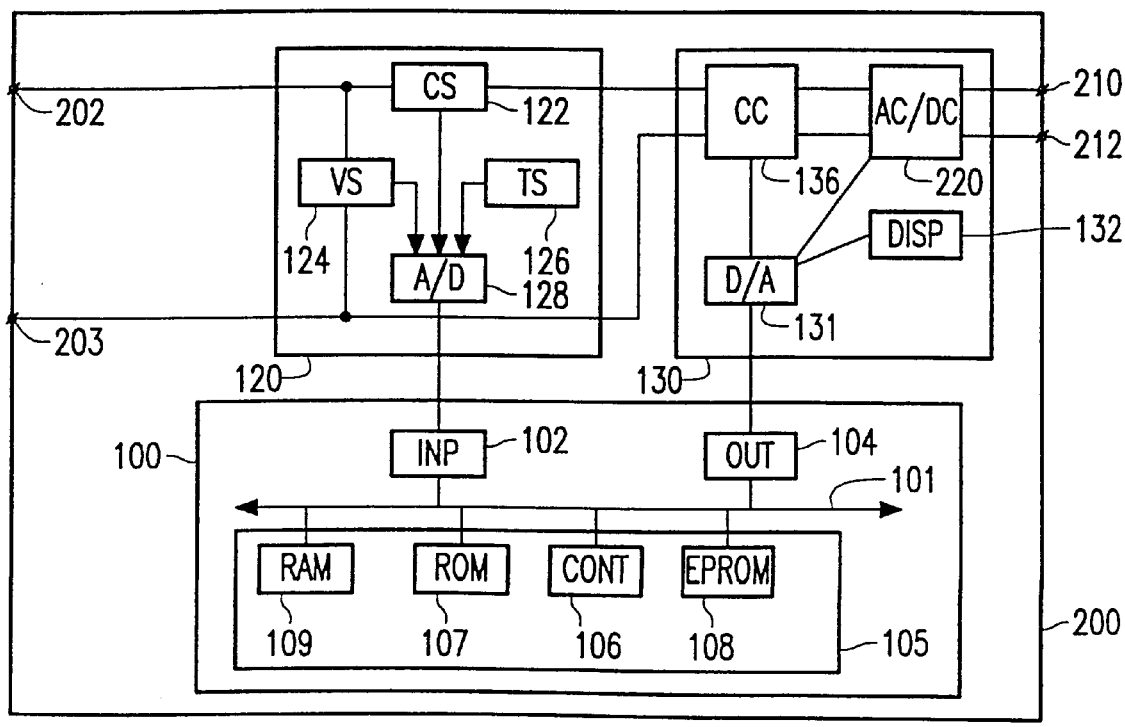
FIG. 2 shows a block diagram of a battery charger/discharger incorporating the battery management system according to the invention.

FIG. 2 illustrates a block diagram of a battery charger 200 incorporating the battery management system 100 according to the invention. Like numerals indicate like means as in FIG. 1. The battery charger 200 comprises at least two terminals 202 and 203 for connection to poles of a battery. It will be appreciated that if the battery charger 200 is included in a consumer product, the battery may be combined with the battery charger 200. The battery charger also comprises at least two terminals 210 and 212 for connecting the battery charger 200 to a power supply. If the battery charger is powered by AC power, advantageously the battery charger comprises an AC to DC converter 220. The AC/DC converter 220 may be implemented in a conventional way, such as using a rectifier and, if required, a transformer. The charging controller 136 preferably comprises means for, under control of the battery management system 100, controlling the charging. The charging controller 136 may be implemented using conventional means, depending on the charging scheme implemented by the battery charger 200. Known charging schemes include constant current charging, constant voltage charging, pulsed current charging and pulsed voltage charging. Also a combination of schemes may be used, such as for instance known from charging Li-ion batteries, where initially a current charging scheme is used until a maximum voltage has been reached, from which moment onwards a (constant) voltage charging scheme is used.

The processing means 105 of the battery management system 100 processes the input signal(s) received via the input means 102. As described before, the input signals represent a physical quantity of the battery, such as current and voltage. Also other relevant signals, such as ambient temperature, may be received as an input signal. It will be appreciated that one or all of the signals may be digital signals or analogue signals. An analogue signal needs to be converted to a digital signal, using an A/D converter, if the processing means 105 is implemented using a microcontroller or microprocessor. It will also be appreciated that the signals may be permanently available or, alternatively, sampled at predetermined intervals, preferably under control of the processing means 105. The processing means 105 uses knowledge of a battery, in the form of a battery model, to generate an output signal via the output means 104. The output signal is derived from a calculated physical quantity of the battery, such as the State of Charge or temperature. The processing means 105 may be limited to calculating the behaviour of one specific type of battery. This is, typically, sufficient for applications where the battery management system 100 and the battery are integrated in a smart battery pack or in a consumer product. For situations where the battery management system 100 is not limited to one type of battery, the battery management system 100, advantageously, includes a specific model for each different type of battery supported by the battery management system 100. Preferably, a communication system is used connecting the battery management system 100 to a smart battery, allowing the battery management system 100 to determine the type of battery and calculate the behaviour of the battery using the most appropriate model. Alternatively, the battery management system 100 may receive input from a user specifying the type of battery. Such input may be received via a user interface of the battery charger 200, which incorporates the battery management system 100. The battery management system 100 may also be able to automatically determine which of the supported models best suits the battery, by, at least initially, calculating a behaviour of the battery using more than one model and choosing the model whose outcome best matches the measured signals. Alternatively, a general purpose battery charger 200 may comprise a battery model which is generalised from models of the supported range of batteries.

In the remainder, as an example details are given for a model of a NiCd battery. It will be appreciated that the same techniques can be used for other devices, such as NiMH, Li-ion, and Li-polymer batteries. The model is based on the electrochemical reactions and physical processes taking place inside the battery. The model is described in the form of mathematical equations. The model equations have been verified using a network approach, wherein the mathematical description of the processes have been converted to an electronic circuit consisting of linear and non-linear circuit elements, representing the model equations. An electrical circuit simulator, such as PSTAR, has been used to analyse the circuit. Techniques for implementing such mathematical equations or, alternatively, the electronic network in the processing means 105 are generally known. One approach is to, similar to the electronic circuit simulator, repeatedly sample the input signals and numerically solve the equations.

The Concept of Sealed Rechargeable NiCd Batteries

Figure 3:
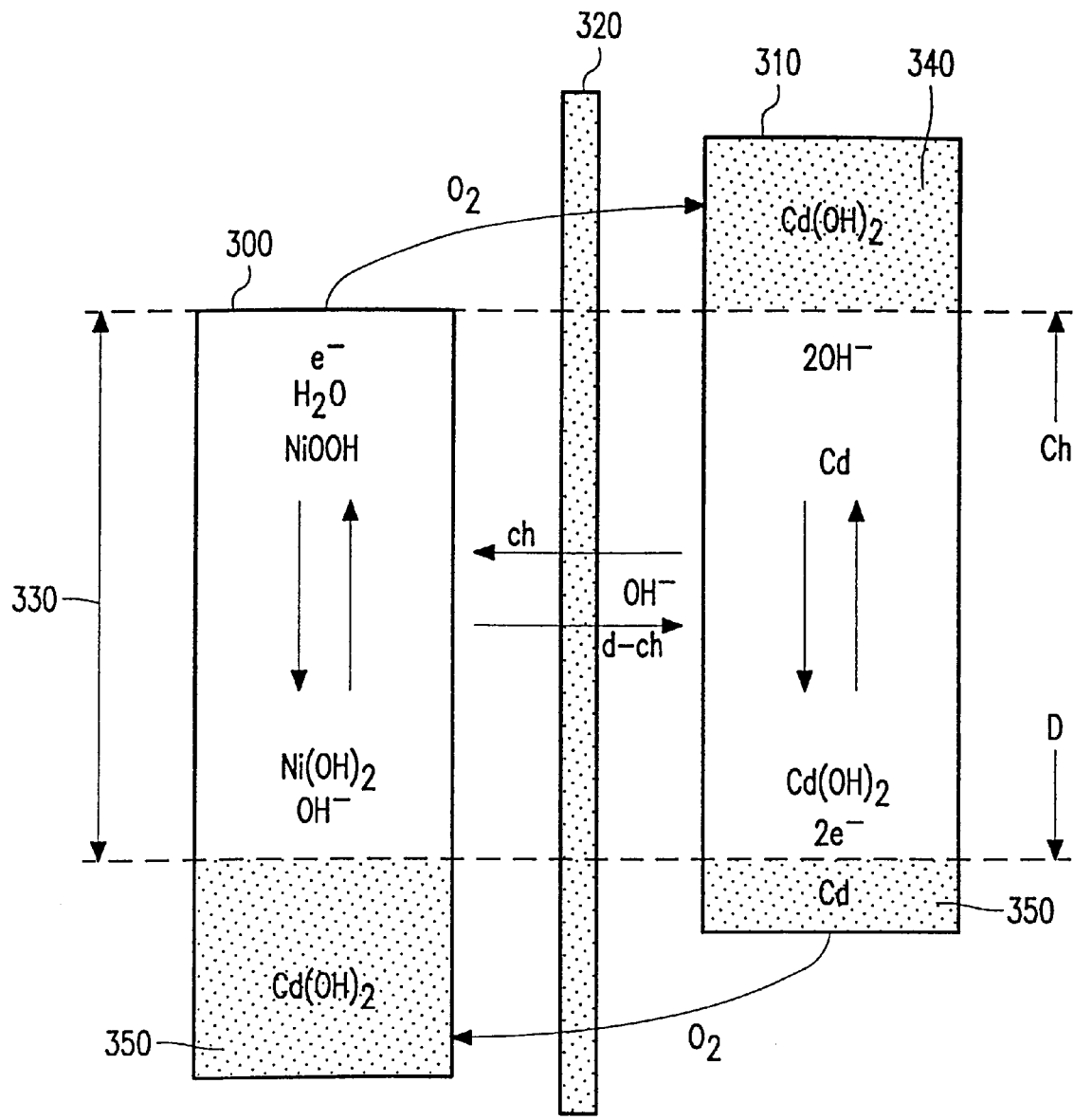
FIG. 3 illustrates main elements and electrochemical reactions of a NiCd battery.

A schematic representation of a NiCd battery is shown in FIG. 3. The battery comprises a nickel electrode 300 and a cadmium-electrode 310 which are electrically insulated from each other by a separator 320. In order to provide ionic conductivity between the two electrodes during current flow, both separator and electrodes are impregnated with a concentrated alkaline solution (not shown). The electrochemically active species involved in the energy storage reactions are indicated in FIG. 3. During charging nickelhydroxide (Ni(OH)$_2$) is oxidized to nickeloxyhydroxide (NiOOH) and cadmiumhydroxide (Cd(OH)$_2$) is reduced to metallic cadmium (Cd). The nominal storage capacity 330 of the battery is indicated by the white areas of both electrodes 300 and 310. The model used by the battery management system 100 includes at least one representation of the main electrochemical storage reaction. For NiCd batteries, the basic electrochemical charge transfer reactions in its most simplified form are as follows:

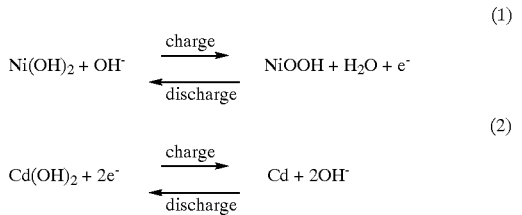

During charging divalent Ni$^{II}$ is oxidized into the trivalent Ni$^{III}$ state and Cd(OH)$_2$ is reduced to metallic Cd. The reverse reactions take place during discharging.

To ensure the well-functioning of sealed rechargeable batteries under all circumstances, typically, the battery is designed in a very specific way, in particular to prevent gas pressure build-up within the batteries during overcharging and overdischarging. The various side-reactions taking place under these conditions will be discussed below.

The Cd-electrode 310 comprises an overcharge reserve 340 in the form of an excess amount of Cd(OH)$_2$, making the Ni-electrode the capacity determining electrode in a NiCd cell. As a consequence, oxidation of OH$^-$ ions is forced to occur at the Ni-electrode during overcharging, through which oxygen evolution starts, according to

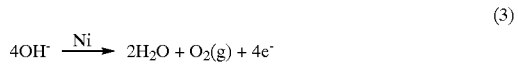

Simultaneously, reduction of Cd(OH)$_2$, in excess present in the Cd-electrode, still continues according to reaction (2). As a result, the partial oxygen pressure within the cell starts to rise and induces electrochemical conversion of O$_2$ at the Cd-electrode according to

Figure 4:
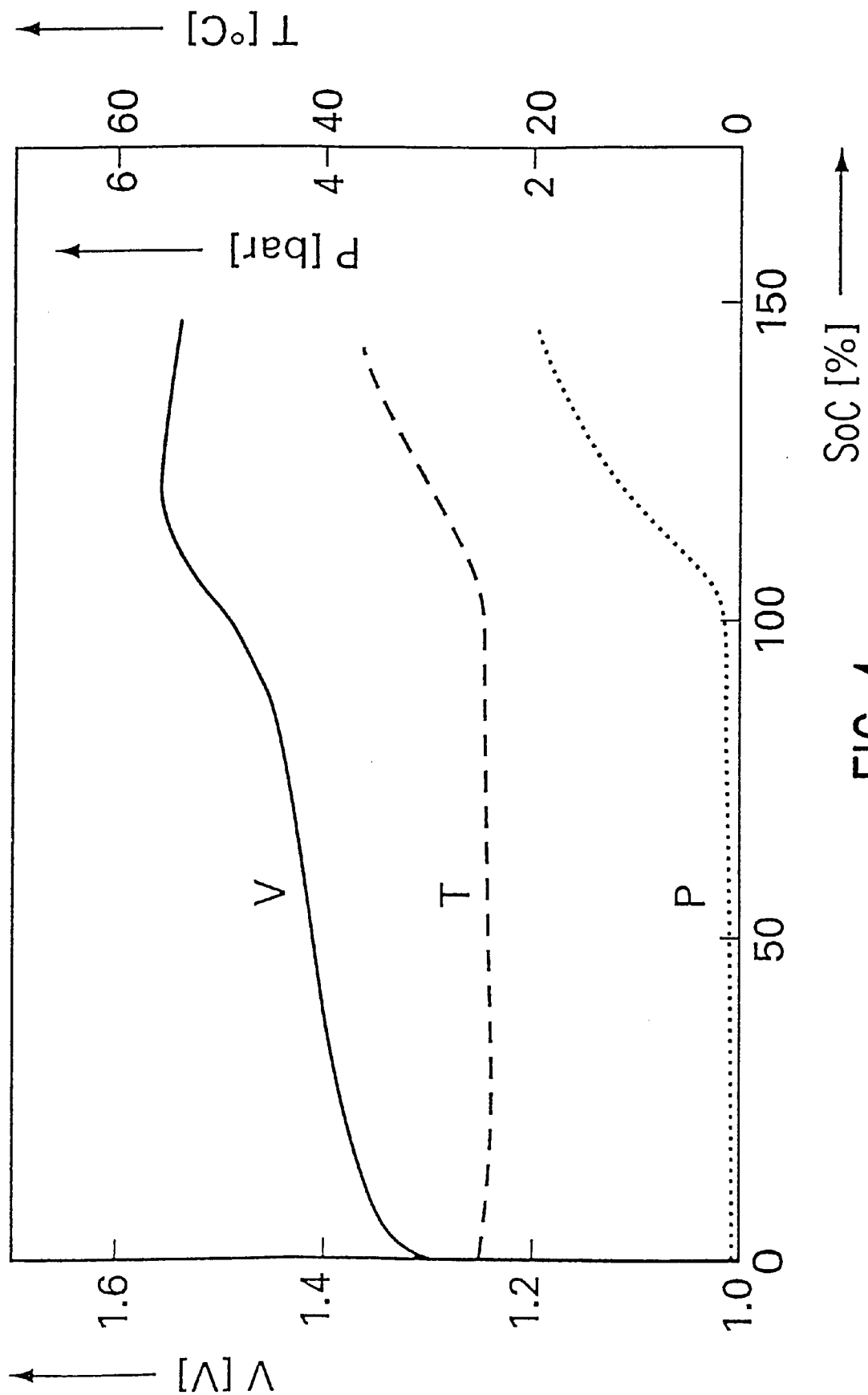
FIG. 4 shows an experimental behaviour of a NiCd battery.

This recombination reaction thus competes with reduction of Cd(OH)$_2$ (reaction (2)). Some investigators claim that O$_2$ can also chemically react with electrochemically formed Cd. The net effect is, however, in both cases the same, i.e. that the recombination reaction limits the internal gas pressure. In the steady-state, the amount of oxygen evolved at the Ni-electrode is equal to the amount of oxygen recombining at the Cd-electrode. This implies that all electrical energy supplied to the battery during overcharging is completely converted into heat. It can be concluded that, dependent on the competition between reaction (2) and (4), the gas pressure and/or the temperature of the battery will rise during overcharging. This is confirmed by experimental curves shown in FIG. 4.

Protection against overdischarging is also of considerable importance, especially when batteries, with inevitably small differences in storage capacity, are used in series. Since a hydrogen recombination cycle has to be avoided due to the poor electrocatalydic activity of the Cd-electrode with respect to the H$_2$ oxidation reaction, usually an overdischarge reserve 350 in the form of a significant amount of Cd(OH)$_2$, generally denoted as depolariser, is added to the Ni-electrode and, to a lesser extent, some metallic Cd is added to the Cd-electrode. During overdischarge the Cd(OH)$_2$ present in the Ni-electrode, is reduced to metallic Cd (reaction (2)), while the excess of metallic Cd is still being oxidized at the Cd-electrode. As the amount of extra Cd with respect to Cd(OH)$_2$ is limited, oxygen gas will be evolved at the Cd-electrode during continuation of the discharge process. Again an oxygen recombination cycle is established, now starting at the cadmium electrode, as indicated in FIG. 3. When this oxygen recombination cycle starts, i.e. when O$_2$ is evolved at the Cd-electrode at positive potentials and converted again into OH$^-$ at the Ni-electrode at very negative potentials, a potential reversal of the battery occurs.

Preferably, the model used by the battery management system 100 also includes a representation of the electrochemical side reaction involving gas, such as for a NiCd battery given by reactions (3) and (4). Advantageously, the model used by the battery management system 100 additionally or alternatively also includes a representation of the electrochemical side reaction involving the overdischarge reserve 350, which for NiCd batteries may be formed by Cd(OH)$_2$ at the Ni-electrode and additional Cd at the Cd-electrode, and involves reaction (2).

Electronic Network Model of a Sealed Rechargeable NiCd Battery

The electrochemical and physical processes occurring in a sealed rechargeable NiCd battery can be described by a set of mathematical equations. For each of these processes an equivalent electronic circuit element can be designated, which behaves according to the corresponding mathematical equation. By combining these electronic circuit elements in an electronic network, a battery model can be created, in which the individual processes as well as the relations between the processes can be modelled.

Figure 5A:
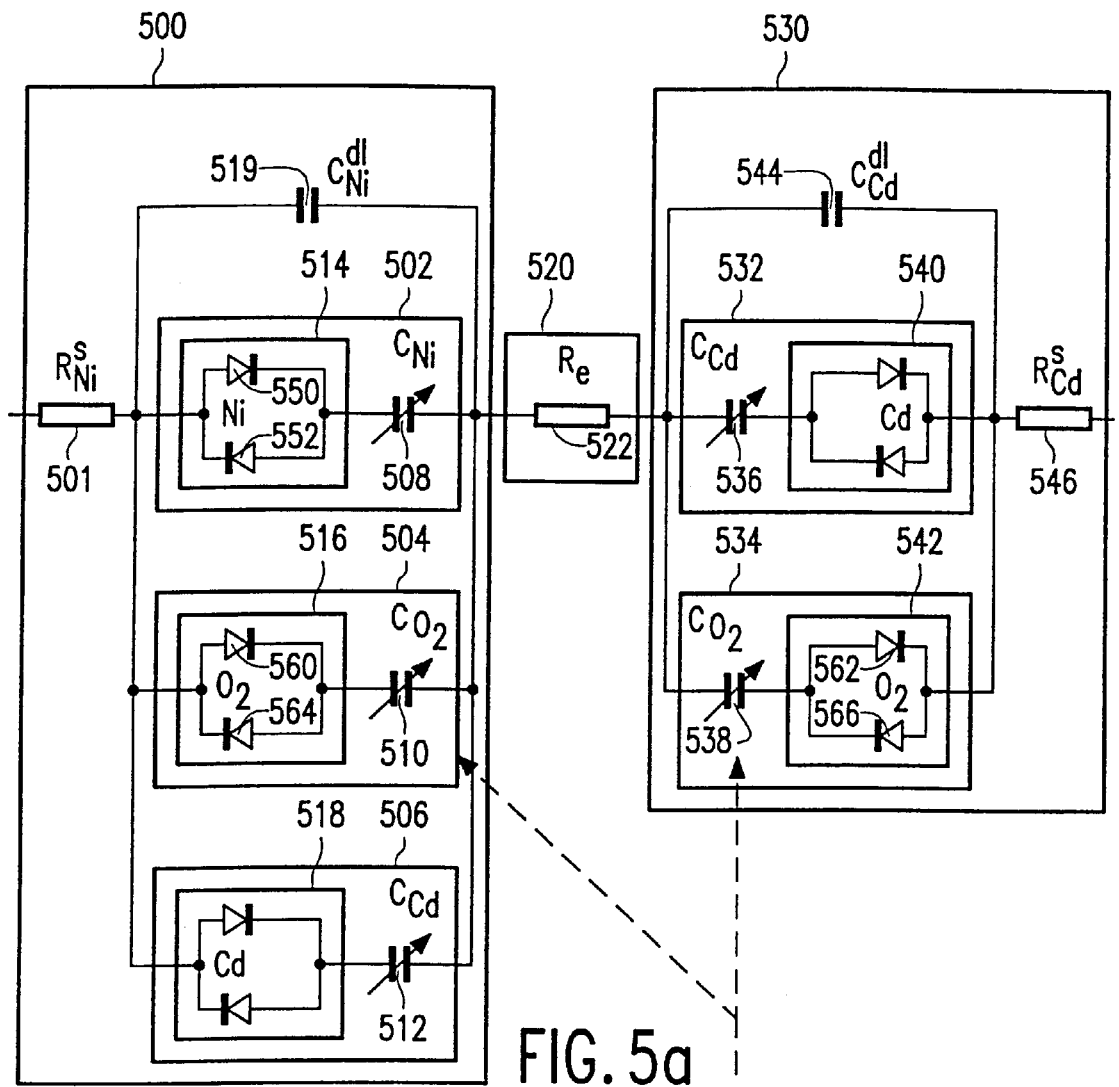
FIG. 5 shows an electrical network representing electrochemical reactions in a NiCd battery.
Figure 5B:
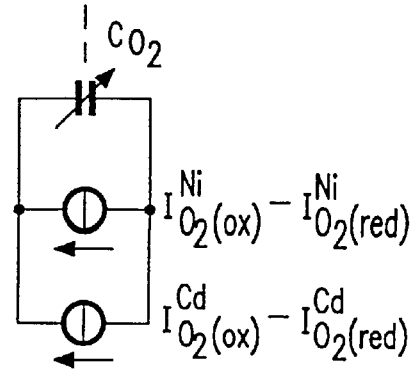

An electronic network model for a sealed rechargeable NiCd battery is shown in FIG. 5 with a main electrical circuit (FIG. 5a) and an auxiliary circuit (FIG. 5b) to calculate the partial oxygen pressure and oxygen reaction equilibrium potential.

In FIG. 5a the three main parts of the NiCd battery can be distinguished in the form of a nickel electrode model 500, an electrolyte model 520 and a cadmium electrode model 530. The nickel electrode model 500 compulses a parallel construction n of three sub-models 502, 504 and 506, each modelling a respective electrochemical reaction: the nickel main charge/discharge reaction, the oxygen overcharge reaction and cadmium overdischarge reaction. Each electrochemical reaction is modelled by a respective variable capacitor 508, 510, 512, in which chemical energy can be stored, in series with a respective block 514, 516, and 518 of two anti-parallel diodes. The anti-parallel diodes describe the kinetics of the oxidation and reduction reactions. The voltage across the variable capacitor equals the equilibrium potential of the reaction considered, whereas the voltage across the anti-parallel diodes represents the reaction overpotential. Apart from the electrochemical reactions taking place at the nickel electrode, the charge separation effect taking place at the electrode surface when the electrode is immersed in the electrolyte, is modelled by a double layer capacitor $Cd_{Ni}^{dl}$ 519 in parallel to the blocks 502, 504, and 506, which also include the reaction diodes. The ohmic material resistance is accounted for by the resistor $R_{Ni}^{s}$ 501. The electrolyte model 520 comprises an ohmic resistor $R_e$ 522. Finally, the model 530 of the cadmium electrode is modelled in an analogue manner to the nickel electrode. The model 530 comprises a sub-model 532 for the cadmium main charge/discharge reaction and a sub-model 534 for the oxygen side reaction. As before, the electrochemical reactions are modelled by a respective variable capacitor 536 and 538, in which chemical energy can be stored, in series with a respective block 540 and 542 of two anti-parallel diodes. The model 530 also comprises a sub-model with the double layer capacitance $C_{Cd}^{dl}$ 544 in parallel to the blocks 532 and 534 for modelling the charge separation effect taking place at the electrode surface when the electrode is immersed in the electrolyte. The ohmic material resistance is accounted for by the resistor $R_{Cd}^{s}$ 546.

It will be appreciated that not all elements of FIG. 5a need to be represented in the model implemented in the battery management system 100. Preferably, ohmic resistance of the electrodes and electrolyte, represented by 501, 522 and 546, are represented in the model, as well as the main electrochemical storage reaction, represented by the sub-models 502 and 532. Preferably, also the charge separation effect at the elertrode surfaces, modelled by 519 and 544, is represented.

Advantageously, in a more advanced embodiment of the battery management system according to the invention, also the side reaction involving gas is represented in the model. For the described NiCd battery this involves oxygen as represented by 504 and 534. It will be appreciated that optionally only the gas side reaction relating to overcharging may be included, which is represented by the diodes 560 and 562 and does not require the diodes 564 and 566.

In a further embodiment of the battery management system according to the invention, the overdischarge reaction, represented by 506 and 532 (for the excess cadmium), is also included. In this embodiment the diodes 564 and 566, representing the aspect of the gas side reaction relating to overdischarging, are included. It will be appreciated that this extension may be in addition to or replacing the overcharge reaction involving gas.

Mathematical Description of the Nickel Elertrode

The electrical double layer capacitance can in its simplest form be modelled by a flat plate capacitor, as indicated by $C_{Ni}^{dl}$ 519 in FIG. 5a. The double layer charging current $I_{dl}(t)$, as a function of the time t, can be represented by:

$$I_{dl}(t) = \frac{d}{dt}(A_{Ni}q) = q(E_{Ni})\frac{dA_{Ni}}{dt} + A_{Ni}\frac{d}{dt}q(E_{Ni}) = q(E_{Ni})\frac{dA_{Ni}}{dt} + A_{Ni}C_{Ni}^{dl}\frac{dE_{Ni}}{dt} \quad (5)$$

where $A_{Ni}$ is the electrode surface area, q the charge density, $C_{Ni}^{dl}$ is the differential double layer capacity and $E_{Ni}$ is the electrode potential. Since the electrode surface area will be more or less constant during electrochemical operation, the term $$q(E_{Ni})\frac{dA_{Ni}}{dt}$$

can be omitted.

For the Ni electrode a one-dimensional approach may be adopted which treats the electrode as a slab of uniform thickness in which the $Ni(OH)_2$ and NiOOH species coexist in a single homogeneous phase of variable composition. Assuming that the charge transfer is a first order reaction, the partial oxidation current $I_{Ni}^{a}$ and reduction reactions current $I_{Ni}^{c}$ can be represented by:

$$I_{Ni}^{a}(t) = nFA_{Ni}k_{Ni}^{0}a_{Ni(OH)_2}(0,t)a_{OH^-}(0,t)\exp\left\{\alpha\frac{nF}{RT}(E_{Ni}(t) - E^{0}_{NiOOH/Ni(OH)_2})\right\} \quad (6)$$

and $$I_{Ni}^{c}(t) = nFA_{Ni}k_{Ni}^{0}a_{NiOOH}(0,t)a_{H_2O}(0,t)\exp\left\{-(1-\alpha)\frac{nF}{RT}(E_{Ni}(t) - E^{0}_{NiOOH/Ni(OH)_2})\right\} \quad (7)$$

where $a_j(0,t)$ refers to the surface (x=0) activity of the various electroactive species j as a function of time (t) and $k^{0}_{Ni}$ is the potential-independent standard rate constant. The latter quantity varies with the temperature according to the Arrhenius equation, i.e.

$$k_j^0 = \gamma e^{-\frac{E_a}{RT}} \quad (8)$$

where $\gamma$ is a pre-exponential factor and $E_a$ is the activation energy. Furthermore, in eqns. (6) and (7) $\alpha$ is the charge transfer coefficient, F is the Faraday constant, R the gas constant and T the temperature. Since the electrode is treated as a solid solution of the ox and red species, the equilibrium potential may be given by the Nernst equation:

$$E_{Ni}^{e}(t) = E^{0}_{NiOOH/Ni(OH)_2} + \frac{RT}{nF}\ln\frac{\bar{a}_{NiOOH}(t)\bar{a}_{H_2O}(t)}{\bar{a}_{Ni(OH)_2}(t)\bar{a}_{OH^-}(t)} \quad (9)$$

where $\bar{a}(t)$ refers to the activities under equilibrium conditions. The standard potential is a temperature dependent quantity, which can be represented by:

$$E_i^0(t) = E^{0}_{i(T=298)} + (T - 298)\cdot\left(\frac{dE_i^0}{dT}\right)_{(T=298)} \quad (10)$$

where $$\left(\frac{dE_i^0}{dT}\right),$$

the temperature coefficient of redox system i (in this case: Ni) in [VK⁻], is related to the entropy change according to $$\Delta S = nF\left(\frac{dE_i^0}{dT}\right).$$

Under equilibrium conditions the electrode potential $E_{Ni}$ is equal to the equilibrium potential $E^e_{Ni}$ and the partial oxidation, $I^a_{Ni}$, and reduction, $I^e_{Ni}$, currents are both equal to the exchange current $I^0_{Ni}$. The latter follows from combination of eqns. (6), (7) and (9) and is given by:

$$I_{Ni}^0(t) = nFA_{Ni}k_{Ni}^0 \bar{a}_{NiOOH}^a(t)\bar{a}_{Ni(OH)_2}^{1-a}(t)\bar{a}_{H_2O}^a(t)\bar{a}_{OH^-}^{1-a}(t) \quad (11)$$

Combining eqns. (6), (7), (9) and (11) yields the general current-voltage relationship for combined diffusion and charge transfer control $$I_{Ni}(t) = I_{Ni}^0(t)\left\{\frac{a_{Ni(OH)_2}(0,t)}{\bar{a}_{Ni(OH)_2}(t)}\exp\left\{\alpha\frac{F}{RT}\eta_{Ni}(t)\right\} - \frac{a_{NiOOH}(0,t)}{\bar{a}_{NiOOH}(t)}\exp\left\{-(1-\alpha)\frac{F}{RT}\eta_{Ni}(t)\right\}\right\} \quad (12)$$

where the overpotential η is defined as the deviation of the electrode potential, $E_{Ni}(t)$, from the equilibrium value $E^e_{Ni}(t)$, i.e.:

$$\eta_{Ni}(t) = E_{Ni}(t) - E_{Ni}^e(t) \quad (13)$$

Here, the overpotential consists of two contributions, the charge transfer overvoltage and the diffusion overvoltage.

It is further assumed that the activities of the electroactive species ($a_i$) may be approximated by their relative molefractions $x_i$, i.e.

$$a_{NiOOH} = \gamma_{NiOOH} \cdot x_{NiOOH} = \gamma_{NiOOH} \cdot \frac{m_{NiOOH}}{m_{NiOOH} + m_{Ni(OH)_2}} \quad (14)$$

$$a_{Ni(OH)_2} = \gamma_{Ni(OH)_2} \cdot x_{Ni(OH)_2} = \gamma_{Ni(OH)_2} \cdot \frac{m_{Ni(OH)_2}}{m_{NiOOH} + m_{Ni(OH)_2}} \quad (15)$$

where $m_i$ is the amount of moles of species i. Since NiOOH and Ni(OH)₂ are present as a solid solution $$x_{NiOOH} + x_{Ni(OH)_2} = 1 \quad (16)$$

For electronic network modelling it is desirable to formulate the above equations in terms of the charge ($Q_{Ni}$) rather than in terms of activities. The charge $Q_{Ni}$ is related to the amount of converted electroactive NiOOH species by means of Faraday's law:

$$\frac{dm_{NiOOH}}{dt} = \frac{I_{Ni}(t)}{nF} \quad (17)$$

Integration of eq. (17) gives:

$$Q_{Ni} = I_{Ni} \cdot t = nFm_{NiOOH} \quad (18)$$

Similarly, the maximum charge can be given by $Q_{Ni}^{max} = nF(m_{NiOOH} + m_{Ni(OH)_2})$. The state-of-charge of the electrode (Θ) follows from equation (18) and is given by the molefraction of NiOOH, i.e.:

$$\Theta = \frac{Q_{Ni}}{Q_{Ni}^{max}} = x_{NiOOH} \quad (19)$$

With these definitions the Nernst equation (eq. (9)) can be rewritten as:

$$E_{Ni}^e(t) = E_{NiOOH/Ni(OH)_2}^0 + \frac{RT}{F}\ln\frac{\bar{a}_{H_2O}(t)}{\bar{a}_{OH^-}(t)} + \frac{RT}{F}\ln\frac{\bar{Q}_{Ni}(t)}{Q_{Ni}^{max} - \bar{Q}_{Ni}(t)} \quad (20)$$

Assuming that during operation the pH at the electrode surface remains constant, the first two terms in eq. (20) can be combined to form a new standard potential $E_{NiOOH/Ni(OH)_2}^{0'}$, which is defined at the operative pH. The general current-voltage relationship given by eq. (12) can be rewritten in terms of Q by $$I_{Ni}(t) = I_{Ni}^0(t)\left\{\frac{Q_{Ni}^{max} - Q_{Ni}(0,t)}{Q_{Ni}^{max} - \bar{Q}_{Ni}(t)}\exp\left\{\alpha\frac{nF}{RT}\eta(t)\right\} - \frac{Q_{Ni}(0,t)}{\bar{Q}_{Ni}(t)}\exp\left\{-(1-\alpha)\frac{nF}{RT}\eta(t)\right\}\right\} \quad (21)$$

with the exchange current given by:

$$I_{Ni}^0(t) = A_{Ni}k_{Ni}^0 \bar{Q}_{Ni}(t)^\alpha (Q_{Ni}^{max} - \bar{Q}_{Ni}(t))^{(1-\alpha)} \bar{a}_{H_2O}^\alpha(t)\bar{a}_{OH^-}^{1-\alpha}(t) \quad (22)$$

The kinetics of the charge and discharge reactions are modelled by the two anti-parallel diodes 550 and 552 in FIG. 5a. The upper diode 550 represents the oxidation reaction according to the first term on the right-hand side in eq. (21), whereas the reduction reaction is represented by the lower diode 552 in accordance with the second term in eq. (21). The voltage across these diodes corresponds to the overpotential for the Ni reaction. The equilibrium potential of the Ni electrode is state-of-charge dependent, in accordance with the Nernst equation (20), and can be recognised in FIG. 5a on the voltage across the variable capacitor $C_{Ni}$ 508.

Figure 6A:
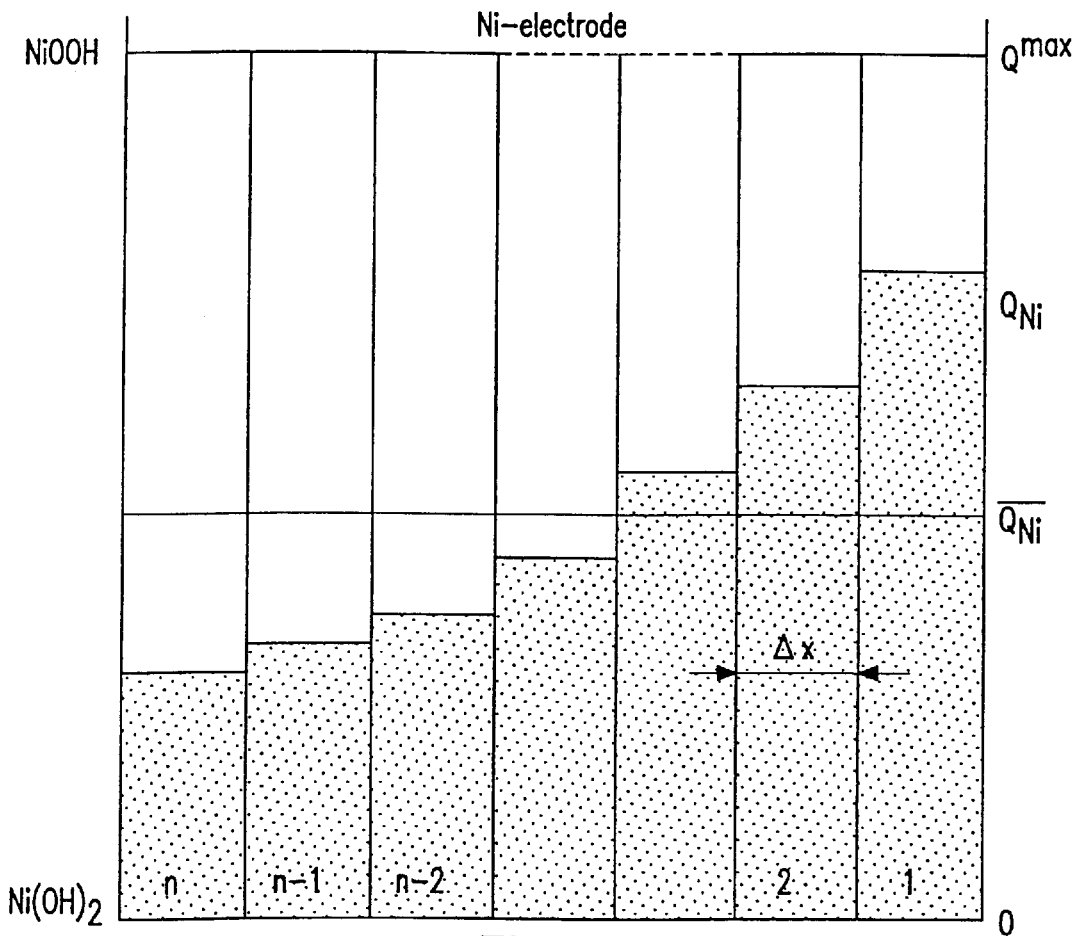
FIG. 6 illustrates a model for proton diffusion in a NiCd battery.
Figure 6B:
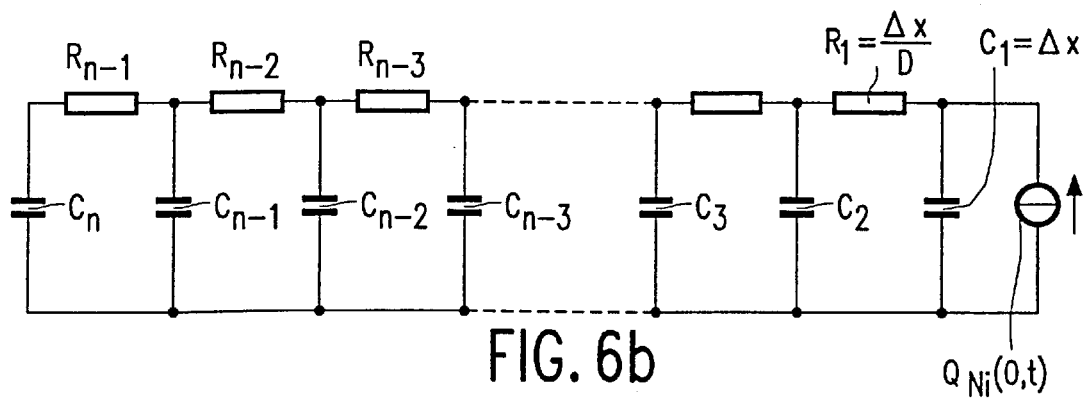

According to eq(21) the state-of-charge of the Ni electrode surface determines the kinetics to a large extent. Preferably, in a further embodiment of the battery management system according to the invention, the model used by the battery management system also includes a representation for modelling ion transport in an electrode. Advantageously, the battery management system calculates the state of the ion transport and the influence on the main electrochemical storage reaction and/or the electrochemical side reaction involving the overdischarge reserve. For a NiCd battery this is achieved by modelling the solid state proton diffusion, which plays an important role in these kinetics. As a result of charging and discharging a proton concentration gradient will be built up, simultaneously changing $Q_{Ni}$ at the electrode surface. In order to calculate $Q_{Ni}$, the solid state diffusion problem can be solved using Fick's laws of diffusion with the appropriate boundary conditions. Fick's first law for the case of linear diffusion states that the flux of the active species is proportional to its concentration gradient, i.e.:

$$J_{H^+}(x,t) = -A_{Ni}D_{H^+}\frac{d}{dx}c_{H^+}(x,t) \quad (23)$$

where $J_{H^+}(x,t)$ denotes the proton flux at location x and at time t, $D_{H^+}$ is the proton diffusion coefficient and $C_{H^+}(x,t)$ the proton concentration at time t and location x. The temperature dependence of the diffusion coefficient also follows Arrhenius behaviour according to:

$$D_{H^+} = D_{H^+}^0 e^{-\frac{E_a}{RT}} \quad (24)$$

with $D_{H^+}^0$ being the temperature independent diffusion coefficient. Advantageously, the temperature dependent terms are also included in the electrical network model in the form of the resistances $$R = \frac{\Delta x}{D}$$

of FIG. 6b and represented in a further embodiment of the battery management system according to the invention.

Fick's second law gives the relation for the concentration change of the active species in time:

$$\frac{d}{dt}c_{H^+}(x,t) = -D_{H^+}\frac{d^2}{dx^2}c_{H^+}(x,t) = \frac{d}{dx}J_{H^+}(x,t) \quad (25)$$

Using the appropriate initial and boundary conditions this diffusion problem can be solved numerically by discretisizing the space variable x into n elements with a thickness $\Delta x$, as illustrated in FIG. 6a. With this procedure Fick's laws given by eqns. (23) and (25) may be rewritten as:

$$J_{H^+}(x,t) = -\frac{D_{H^+}}{\Delta x}[c_{H^+}(x+\Delta x, t) - c_{H^+}(x,t)] \quad (26)$$

$$\frac{d}{dt}c_{H^+}(x,t) = \frac{[J_{H^+}(x+\Delta x, t) - J_{H^+}(x,t)]}{\Delta x} \quad (27)$$

The relation between the proton concentration and charge is found by means of Faraday's law (eq. (17)) and reads:

$$c_{H^+}(x,t) = \frac{Q(x,t)}{nFA\Delta x} \quad (28)$$

where $A\Delta x$ is the volume per discrete element. In eq. (28) $Q(x,t) = Q_{Ni}^{max}(x,t) - Q_{Ni}(x,t)$, because the proton concentration gradient is equal to the gradient of $Ni(OH)_2$. The protonflux is related to the current by means of:

$$J(x,t) = \frac{I_{Ni}(x,t)}{nFA} \quad (29)$$

Combining eqns. (28) and (29) with eqns. (26) and (27) gives:

$$I(x,t) = \frac{D_{H^+}[Q(x+\Delta x, t) - Q(x,t)]}{\Delta x^2} \quad (30)$$

$$\frac{d}{dt}\frac{Q(x,t)}{\Delta x} = \frac{I(x+\Delta x, t) - I(x,t)}{\Delta x} \quad (31)$$

Fick's second law, given by eq. (31), is equivalent to the electrical equation for a capacitor, i.e. $I=CdV/dt$, with $C\equiv\Delta x$ and $V=Q/C\equiv Q/\Delta x$. In the same way eq. (30) can be shown to be equivalent to the electrical Ohm's law, i.e $I=V/R$ again with $V=Q/C\equiv Q/\Delta x$ and with $R\equiv\Delta x/D_{H^+}$. This similarity shows that the finite diffusion process may be modelled electrically as a finite RC-ladder network, as shown in FIG. 6b. The current flowing through the current source is equal to the reaction current $I_{Ni}=I_{Ni}^a-I_{Ni}^c$. Each electrode element is represented by a diffusion resistance $R_j(j=1\ldots n-1)$ and a diffusion capacitance $C_j(j=1\ldots n)$. The difference between the current flowing into and out of each element is given by the currents $I_j$, which flow into the diffusion capacitors. Thus, the charge on each $C_j$ represents the state-of-charge of the corresponding electrode element. The charge on the first capacitor $(C_j)$ in the diffusion network of FIG. 6b corresponds to surface charge $Q_{Ni}(0,t)$ and is used for the calculation of $\eta_{Ni}$ in eq (21). $\overline{Q}_{Ni}$ is obtained from the sum of all charges on the capacitors in the diffusion network $$\sum_{i=1}^{n} Q_i,$$

where $Q_i$ can be obtained by integrating eq. (31) over time. The following table summarises the analogy between electrical and electrochemical variables.

| | Electrical | | Electrochemical |
|---|---|---|---|
| resistance | R [Ω] | | $\equiv \frac{\Delta x}{D_{H^+}}$ [s/m] |
| capacitance | C [F] | | $\equiv \Delta x$ [m] |
| voltage | $V\left(\frac{Q}{C}\right)$ [V] | | $\equiv \frac{Q(x,t)}{\Delta x}$ [C/m] |
| Ohm's law | $i = \frac{V}{R}$ [A] | Fick's first law of diffusion (eq. (30)) | $i \equiv \frac{D_{H^+}Q}{\Delta x^2}$ [A] |
| Capacitor equation | | Fick's second law of diffusion (eq. (31)) | $i \equiv \Delta x \frac{d}{dt}\frac{Q(x,t)}{\Delta x}$ |

Mathematical Description of the Cadmium Electrode

The cadmium electrode is modelled as a heterogeneous system composed of two separate phases, the metallic cadmium and an oxide layer consisting of $Cd(OH)_2$. Cadmium oxidation and the reduction of the oxide film is considered to occur according to a dissolution/precipitation mechanism in which the electrochemical charge transfer reaction is preceded or followed by a chemical dissolution or precipitation reaction. This reaction sequence can be represented by the chemical step:

$$\text{dissolution: } Cd(OH)_2 + 2OH^- \underset{\text{discharge}}{\overset{\text{charge}}{\rightleftarrows}} Cd(OH)_4^{2-} \quad (32)$$

followed by the charge transfer:

$$\text{precipitation: } Cd(OH)_4^{2-} + 2e^- \underset{\text{discharge}}{\overset{\text{charge}}{\rightleftarrows}} Cd + 4OH^- \quad (33)$$

It is assumed that the $Cd(OH)_4^{2-}$ species precipitates to form the $Cd(OH)_2$ film after a certain degree of supersaturation has been reached, and that this reaction is sufficiently fast to consider the total reaction rate to be controlled by the electrochemical step. The electrochemical reaction rate is assumed to be determined by combined charge transfer and mass transfer of the $OH^-$ and $Cd(OH)_4^{2-}$ species. Furthermore, it is assumed that charge transfer takes place only at the metallic cadmium surface, since the $Cd(OH)_2$ layer is a poor conductor.

The general current-voltage relationships for the partial oxidation current $I_{Cd}^a$ and reduction current $I_{Cd}^c$ in this case are given by:

$$I_{Cd}^a(t) = \quad (34)$$
$$nFA_{Cd}(Q_{Cd}(t))k_{Cd}^0 a_{Cd} a_{OH^-}^4(0,t)\exp\left\{\alpha\frac{nF}{RT}(E_{Cd}(t) - E_{Cd/Cd(OH)_2}^0)\right\}$$

and $$I_{Cd}^c(t) = nFA_{Cd}(Q_{Cd}(t))k_{Cd}^0 a_{Cd(OH)_4^{2-}}(0,t) \quad (35)$$
$$\exp\left\{-(1-\alpha)\frac{nF}{RT}(E_{Cd}(t) - E_{Cd/Cd(OH)_2}^0)\right\}$$

where $A_{Cd}$ denotes the metallic Cd surface area, $Q_{Cd}$ the state-of-charge of the cadmium electrode, $k_{Cd}^0$ the potential independent standard heterogeneous rate constant and $E_{Cd}$ the cadmium electrode potential. The activities $a_{OH^-}(0,t)$ and $a_{Cd(OH)_4^{2-}}(0,t)$ refer to the activities of the $OH^-$ and $Cd(OH)_4^{2-}$ species at the electrode/electrolyte interface, respectively.

The equilibrium potential, $E_{Cd}^e$, of the two-phase cadmium electrode system is given by:

$$E_{Cd}^e = E_{Cd/Cd(OH)_2}^0 + \frac{RT}{nF}\ln\frac{\bar{a}_{Cd(OH)_4^{2-}}}{\bar{a}_{Cd} \cdot \bar{a}_{OH^-}^4} \quad (36)$$

Under equilibrium conditions $I_{Cd}^a = I_{Cd}^c = I_{Cd}^0$ and $E_{Cd} = E_{Cd}^e$. Combination of eqns. (5), (34) and (35) gives the relationship for the exchange current:

$$I_{Cd}^0(t) = nFA_{Cd}(Q_{Cd}(t))k_{Cd}^0 \bar{a}_{Cd}^\alpha \bar{a}_{OH^-}^{1-\alpha}\bar{a}_{Cd(OH)_4^{2-}} \quad (37)$$

It is assumed that the bulk equilibrium activities of the $OH^-$ and the $Cd(OH)_4^{2-}$ remain constant, the latter being determined by the solubility of cadmiate in the electrolyte. Furthermore, the bulk equilibrium activity of the metallic cadmium species is unity by definition. Therefore, the exchange current merely depends on the state-of-charge through its dependency on the metallic cadmium surface area. For the same reasons, the equilibrium potential, given by eq. (36), is independent of the state-of-charge of the electrode and shows only a temperature dependency. Combining eqns. (34)–(37) leads to the general current-voltage relationship:

$$I_{Cd}(t) = I_{Cd}^0(t)\left\{\frac{a_{OH^-}^4(0,t)}{\bar{a}_{OH^-}^4}\exp\left\{\alpha\frac{nF}{RT}\eta_{Cd}(t)\right\} - \right. \quad (38)$$
$$\left. \frac{a_{Cd(OH)_4^{2-}}(0,t)}{\bar{a}_{Cd(OH)_4^{2-}}}\exp\left\{-(1-\alpha)\frac{nF}{RT}\eta_{Cd}(t)\right\}\right\}$$

with $\eta_{Cd}(t)$ given by $\eta_{Cd}(t) = E_{Cd}(t) - E_{Cd}^e$. The mass transport controlled terms of eq. (38), i.e. $a_{Cd(OH)_4^{2-}}$ and $a_{OH^-}$, can be found from the solution of the diffusion problem. Using Fick's laws of diffusion and assuming that the diffusion layer thickness is about 10 $\mu$m, and the diffusion coefficients of both species are of the order of $10^{-9}$ m$^2$/s it can be calculated that the time required to build a layer of this thickness is of the order 0.1 s, which is much smaller than the usual charge/discharge time. Therefore, stationary mass transport can be considered and the kinetics of the reduction reaction is under mixed control and can be expressed by:

$$I_{Cd}^c(t) = A_{Cd}(Q(t))\frac{I_d \cdot I_k}{I_d + I_k} \quad (39)$$

where $I_d$ the limiting diffusion current given by $$I_d = nFA_{Cd}D_{Cd(OH)_4^{2-}}\bar{c}_{Cd(OH)_4^{2-}}/\delta \quad (40)$$

and $I_k$ the limiting kinetically controlled current given by $$I_k = nFA_{Cd}k_{Cd}^0\bar{a}_{Cd}^{1-\alpha}\bar{a}_{OH^-}^{4(1-\alpha)}\bar{a}_{Cd(OH)_4^{2-}}^\alpha\exp\left\{-(1-\alpha)\frac{nF}{RT}\eta_{Cd}(t)\right\} \quad (41)$$

The solution for $I_{Cd}^a$ is identical to eq. (39) since the mass transport problem during oxidation and reduction is symmetrical. From eq. (39–41) it is clear that $A_{Cd}$ is an important parameter for the kinetics of the Cd electrode. Evidently, $A_{Cd}$ is dependent on the state-of-charge and a mathematical description of this process is therefore desired.

During charging and overdischarging of the battery a metallic cadmium phase is formed at the cadmium and the nickel electrode, respectively. This new phase starts with the formation of single metallic nuclei. These grow further to form. small metallic particles, which eventually coalesce to form a surface coating. It is assumed that the nuclei are formed instantaneously and are hemispherical. The "extended" surface, $\theta_{ex}$, covered by N separate hemispherical particles is given by $\theta_{ex} = \theta Nr^2(t)$, with the radius $r(t)$ following from the volumetric amount of deposited material according to:

$$V(t) = \frac{2}{3}\pi Nr^3(t) = V(0) + \frac{M_{Cd}}{\rho_{Cd}F}\int_{t_0}^t i(u)du \quad (42)$$

where $M_{Cd}$ represents the molecular weight of the cadmium species and $\rho_{Cd}$ its density. Furthermore, in eq. (42) V(0) corresponds to the volume of the deposit at the time $t_0$. This consists of both the volume of the initial amount of material present at the electrode and the volume of the metallic clusters formed during the nucleation stage. The integral term in eq. (42) is equivalent to the amount of charge, Q(t), formed during the growth of the assembly of metallic clusters. From eq. (42) it follows that the extended surface is given by:

$$\Theta_{ex} = \pi N r^2(t) = (\pi N)^{1/3} \left(\frac{3M_{Cd}}{2\rho_{cd}F}\right)^{2/3} (Q_{Cd}(0)^{2/3} + Q_{Cd}(t)^{2/3}) \quad (43)$$

After some time the growing particles will coalesce, causing the growth rate to decrease at the contact areas and to continue only in the direction perpendicular to the electrode surface. In this case, the actual covered surface, $A_{Cd}$, is smaller than the extended surface resulting from the summation of the areas covered by all individual particles. Therefore, a correction should be made for the overlapping areas. The relation between the real and the extended surface is given by Avrami's theorem (refer "M. Avrami, Journal of Chemistry and Physics, Vol. 7 (1939) page 1103":

$$A_{Cd} = A_{Cd}^{max}(1 - e^{-\Theta_{ex}}) \quad (44)$$

where $A_{Cd}^{max}$ refers to the maximum surface area of the cadmium electrode.

The Oxygen Formation/Recombination Cycles

During charging and overcharging oxygen evolves at the nickel electrode and recombines at the cadmium electrode. During overdischarging oxygen evolution takes place at the cadmium electrode and recombines at the nickel electrode, as illustrated in FIG. 3. It is assumed that the oxygen evolution reaction is purely activation controlled in all cases. The kinetics can be described by:

$$I_{O_2}^a(t) = I_{O_2}^0(t) \exp\left\{\frac{\alpha n F \eta_{O_2}(t)}{RT}\right\} \quad (45)$$

when $\eta_{O_2}(t) > 60$ mV, which is the case under almost all conditions. The exchange current $I_{O_2}^0(t)$ in eq. (45) is given by:

$$I_{O_2}^0(t) = nFA_j k_{O_2,j}^0 a_{O_2}^\alpha(t) a_{H_2O}^{2\alpha} a_{OH^-}^{4(1-\alpha)} \quad (46)$$

where $k_{O_2,j}^0$ and $A_j$ refer to the standard heterogeneous rate constant and the electrode surface area, respectively, at either the nickel electrode (during charging) or cadmium electrode (during overdischarging). In eq. (46) the activities refer to the activities at the electrode/electrolyte interface. The activities of $H_2O$ and $OH^-$ are assumed to be time-independent. As in the case of the nickel and the cadmium electrode reactions, the overpotential $\eta_{O_2}(t)$ is defined as the potential difference between the electrode potential, E(t), and the equilibrium potential of the oxygen oxidation/reduction reaction, $E_{O_2}^e(t)$, given by:

$$E_{O_2}^e(t) = E_{O_2/OH^-}^o + \frac{RT}{nF} \ln a_{O_2}(t) \quad (47)$$

In this equation $a_{H_2O}$ and $a_{OH^-}$ are included in $E_{O_2/OH^-}$ since it is assumed that they remain constant.

The relationship between the oxygen activity in the liquid phase and the partial oxygen pressure, $P_{O_2}$, is given by means of the oxygen solubility constant. The solubility equilibrium may be written as:

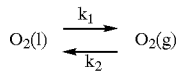

(48)

with $k_1$ and $k_2$ the corresponding reaction rate constants. Considering $O_2$ as an ideal gas it follows that $$a_{O_2}(l) = K_{O_2}^l P_{O_2} \quad (49)$$

where $K_{O_2}^l = k_1/k_2$ is the oxygen solubility. At the electrolyte concentration which is typically present in a NiCd battery (e.g. 8M KOH), the oxygen solubility was experimentally found to be almost independent of temperature. Therefore, in the present NiCd battery model no temperature dependence of the $K_{O_2}^l$ is introduced. Insertion of eq. (49) into eqns. (46) and (47) gives the dependence of the equilibrium potential and the exchange current of the oxygen evolution reaction on the partial oxygen pressure.

Due to the low solubility of oxygen in the electrolyte most of the oxygen is transported towards the Cd electrode during (over)charging (or towards the Ni electrode during overdischarging) through the available free space in the battery. In order for the oxygen to react it redissolves and then diffuses through the porous structure of the cadmium electrode towards the active recombination sites. The oxygen recombination reaction is assumed to occur under mixed kinetic/diffusion control. Similar as for the Cd electrode it can be argued that on a longer time scale (longer than 0.1 sec.) a stagnant diffusion layer thickness will be established. The overall kinetics of the recombination reaction can then be represented by $$I_{O_2}^c(t) = \frac{I_k(t) \cdot I_d(t)}{I_k(t) + I_d(t)} \quad (50)$$

where the kinetically-controlled $I_k$ is given by $$I_k(t) = I_{0,O_2}(t) \exp\left\{-(1-\alpha)\frac{nF}{RT}\eta_{rec}(t)\right\} \quad (51)$$

where $\eta_{rec}$ is the overpotential for the oxygen recombination reaction at the Cd-electrode, and the diffusional part $I_d$ is given by $$I_d(t) = nFA \frac{D_{O_2}}{\delta} \bar{a}_{O_2}(t) \quad (52)$$

Herewith it is assumed that the oxygen concentration at the electrode surface approaches zero, i.e. that a linear concentration gradient is established.

In the same way as described before, the kinetics of the oxygen reactions at both the Ni and Cd electrode can be represented by two anti-parallel diodes, which cover the equations described above. Apart from the main nickel and cadmium reactions and the oxygen evolution/recombination side reactions in a further embodiment of the battery management system according to the invention, the processing means of the battery management system calculates a battery pressure based on a pressure model of a pressure development in the battery and calculates the behaviour of the oxygen evolution/recombination side reactions in dependence on the calculated battery pressure. To this end, the network also comprises an auxiliary circuit, as illustrated in FIG. 5b, to calculate the partial oxygen pressure from the net amount of oxygen present inside the battery, according to:

$$\frac{dp_{O_2}}{dt} = \frac{RT}{nFV_g}(I_{O_2}^a - I_{O_2}^c) \quad (53)$$

For each electrode the amount of oxygen produced or consumed is determined by the difference between the oxidation and reduction current. If oxygen is produced at one electrode, it is recombined at the other electrode. The net amount of oxygen produced equals the difference between these two current sources and is integrated in capacitor C.

Besides calculating the partial oxygen pressure, another function of the sub-circuit of FIG. 5b is to determine the equilibrium voltage according to eq. (47). This equilibrium voltage is used for both oxygen reactions occurring at the nickel and at the cadmium electrodes and is copied to both oxygen paths for this purpose.

The Cadmium Overdiscnarge Reaction at the Nickel Electrode

To prevent hydrogen evolution from taking place inside the battery during overdischarging, some $Cd(OH)_2$ is added to the nickel electrode to act as overdischarge reserve. The kinetics of this cadmium reaction are the same as those for the cadmium electrode and are thus given by eqns. (34) and (35). The determination of the concentration terms appearing in these equations, is described by eq. (39–41). The cadmium side reaction is modelled as a current path in parallel to the nickel main reaction illustrated by block 506 in FIG. 5a. As before, the oxidation and reduction reactions are modelled by the two anti-parallel diodes 518. The equilibrium potential of the cadmium reaction is again given by the Nernst equation and is represented by the voltage across the variable capacitor 512.

The Temperature Development

Figure 7:
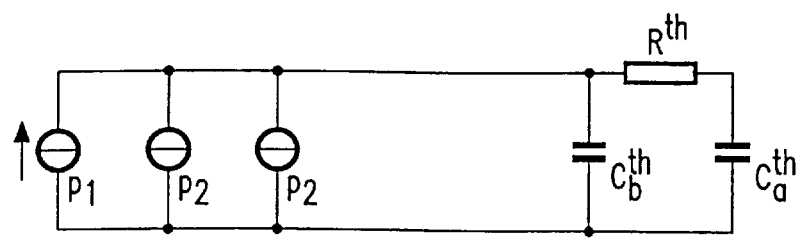
FIG. 7 shows an electrical network modelling the development of the temperature of a battery.

In a further embodiment of the battery management system according to the invention the battery temperature is modelled as depending on an internal heat flow generated in the battery. The battery temperature is determined by the net amount of heat ($Q_b^{th}$) present inside the battery and the heat capacitance ($C_b^{th}$) of the battery. Preferably, also the heat resistance ($R_b^{th}$) between the battery and its environment is modelled. The net heat flow is determined by the difference between the heat flow (($\Phi_{in}$) generated inside the battery and the heat flow ($\Phi_{out}$) to the environment, i.e. ($\Phi_{tot} = \Phi_{in} - \Phi_{out}$). Note that when the battery temperature exceeds the ambient temperature, $\Phi_{out}$ is directed towards the environment, whereas when the ambient temperature exceeds the battery temperature, $\Phi_{out}$ flows into the battery. The net heat flow is integrated in the heat capacitance, as is shown in FIG. 7. The voltage across $C_b^{th}$ and $C_a^{th}$ represent the battery and the ambient temperature, respectively.

The heat flow, $\Phi_{in}$, produced by the battery during operation is given by:

$$\Phi_{in} = \sum_j I_j \frac{-T\Delta S_j}{n_j F} + \sum_j I_j \eta_j + I_b^2 R_\Omega \quad (54)$$

The three terms of eq. (54) are, respectively, illustrated by P1, P2 and P3 of FIG. 7. The summation terms in eq. (54) refer to the heat production resulting from individual electrochemical reactions occurring inside the battery. Preferably, the heat production of all electrochemical reactions modelled by a chosen embodiment of the battery management system is incorporated. The third term refers to the power dissipated through the internal ohmic resistance. In this term $I_b$ is the total current flowing through the battery and $R_\Omega$ the total ohmic resistance given by $R_\Omega = R_{Ni} + R_{Cd} + R_e$. The first summation term in eq. (54) refers to the entropy change ($\Delta S_j$) resulting from each reaction with a number of $n_j$ electrons involved. The second term describes the power loss through each reaction-resistance and is given by the product of the partial current, $I_j$, and the corresponding overvoltage, $\eta_j$, of each electrochemical reaction. The entropy term can be both positive or negative, depending on the signs of $I_j$ and $\Delta S_j$. The other two terms are positive, because $I_j$ and $\eta_j$ have the same sign by definition. As a result, $\Phi_{in}$ may be either positive or negative, depending on the magnitude of the three terms.

The heat flow $\Phi_{out}$ is given by Fourier's law, i.e.:

$$\Phi_{out} = \alpha A_b (T_b - T_a) \quad (55)$$

where $\alpha$ is the combined convection-radiation heat transfer coefficient, $A_b$ is the surface area of the battery and $T_b$ and $T_a$ are the battery and ambient temperatures, respectively. The thermal heat resistance $R_b$, th is defined as $1/\alpha A$. It is assumed that the heat resistance for conduction of heat inside the battery is so small that the temperature inside the battery may be considered uniform. In a simple form, for the ambient temperature $T_a$ a constant value is chosen, which preferably represent the ambient temperature of a typical environment in which the battery is used. Advantageously, for $T_a$ a measured ambient temperature is used.

The heat $Q_b^{th}$ stored inside the battery is given by:

$$Q_b^{th} = \int \Phi_{tot} dt = C_b^{th} T_b \quad (56)$$

where $C_b^{th}$ is the heat capacity of the battery.

There is a clear mathematical analogy between the heat transport equations and electrical charge transport equations. For instance, the electrical analogy of eq. (55) is the ohmic law for a resistor and the electrical analogy of eq. (56) is the equation for a capacitor. The mathematical analogy between electrical and thermal variables is summarised in the following table:

| | Electrical | | Thermal | |
|---|---|---|---|---|
| voltage | V [V] | | temperature | T [K] |
| current | I [A] | | heat flow | $\Phi$ [W] |
| resistance | R [$\Omega$] | | heat resistance | $R^{th}$ [K/W] |
| capacitance | C [F] | | heat capacitance | $C^{th}$ [J/K] |
| Ohm's law | $i = \dfrac{V}{R}$ | | Fourier's law | $\Phi = \dfrac{\Delta T}{R^{th}}$ |
| capacitor equation | $i = C\dfrac{dV}{dt}$ | | heat capacitance equation | $\Phi = C^{th}\dfrac{dT}{dt}$ |

Due to the mathematical analogy, heat transfer problems can be analysed by means of an electrical circuit. If a one-dimensional heat diffusion approach is used, the battery heat transfer problem can be represented by the scheme given in FIG. 7. The total heat flow $\Phi_{in}$ produced by the battery is built up of the partial flows given by eq. (54). The temperature is an extremely important parameter, which appears in practically all equations described above. The battery management system according to the invention implements the temperature dependency of the main storage reaction, as for instance shown by equations (43) and (44) via T and equations 25 and 43 via k.

It will be appreciated that the network model can easily be extended to more complex systems. For example, several heat sources and/or sinks with different origin can easily be added, resulting in a more complex thermal behaviour.

Modifications of and Extensions to the Model

It will be appreciated that the model can easily be applied to types of batteries other than NiCd, such as Li-ion, Li-polymer and NiMH. Furthermore, the model can easily be extended, by including further sub-models, such as:

modelling cycle life degradation of a battery, for instance, due to oxidation of active species as a function of the number of charge/discharge cycles modelling the development of $H_2$-gas in an aqueous system, which may occur, for instance, during overdischarging in a NiCd battery when no or a too small $Cd(OH)_2$ overdischarge reserve is used at the Ni-electrode, modelling the development of gaseous products for Li-ion batteries, for instance, due to the decomposition of the electrolyte, modelling transport of $Li^+$-ions for Li-ion or Li-polymer batteries, and in general, modelling other species.

Use of the Model for Simulating a Battery

It will be appreciated that the battery model can be used in a battery management system, which may be incorporated in an encompassing product, such as a smart battery or a battery charger. Advantageously, the model may also be used in a simulation tool, such as PSTAR. Such a simulation tool can, for instance, be used for:

developing new batteries, selecting batteries for a specific product, for instance by taking into consideration the operating conditions of such a product, such as the power required during operation of the product and heat development in the transformer and electronics during charging of the product; and designing a battery management system for a specific type of battery, for instance by simulating various charging schemes, such as constant-current charging, constant-voltage charging, pulsed-current charging and pulsed-voltage charging.

The battery simulator is used to simulate characteristics of the battery, based on input parameters which represent a physical quantity of a battery. Iteratively the input parameters can be adjusted, where for each set of input parameters it is checked whether a battery design based on the then selected design input parameters provides the required result. An example of a design parameter which can be chosen is the particle size of the electrode material, which in turn contributes to the surface area of the electrode and, as such, influences the charge transfer kinetics. If the simulation shows that the calculated characteristic(s) meet a predetermnined criterion (e.g. the supplied current is sufficient for a given duration of stand-by power consumption and full power consumption), the battery is produced based on the design parameters which gave the desired result. The selected parameter values may directly or indirectly determine aspects such as:

the surface area of the electrode material, as expressed by the specific surface area of the Ni and Cd electrodes in the list of parameters in the appendix, the composition of the electrochemically active species of the electrodes involved in the energy storage reaction, as for instance expressed by the exchange current density parameters, whether and the extent in which use is made of other battery materials, such as resistance lowering materials (e.g. LiOH to influence the resistance of the electrolyte, or conductive additives, such as carbon or graphite, to influence the resistance of the electrodes), and whether and the extent in which surface depositing of other metals or materials on the electrode(s) takes place, e.g. influencing the exchange current density parameters and the surface area parameters.

As a consequence, the parameters may determine the chemical composition of the battery (e.g. which battery materials should be used) and/or physical characteristics of the battery materials or the battery (e.g. determining that raw electrode materials should be pre-processed in order to enlarge the surface area).

Temperature-Controlled Charging

Experiments and simulations of the model according to the invention have shown that the temperature has a significant influence on the charging. In a further embodiment according to the invention, the battery management system 100 of FIG. 2 controls the battery charger 200 by maintaining the battery temperature substantially at a predetermined temperature curve. In a simple form, the battery temperature is maintained at a constant temperature of, for instance, 30° C. Alternatively, the battery temperature is maintained at a predetermined offset, for instance 10° C., related to the ambient temperature. It will be appreciated Lhat also more advanced curves may be used, which allow the battery to be charged more fully or quicker.

The described simulation tool can efficiently be used to design an optimum temperature curve for a specific application and operating environment. It will be appreciated that any conventional control loop may be used to control the battery charger 200 in such a way that the battery temperature substantially matches the predetermined temperature curve. As an example, the current or voltage level supplied by the battery charger 200 may be controlled by the control loop. Alternatively, the battery charger 200 may use a pulsed-voltage or pulsed-current charging scheme, where the control loop controls, for instance, the pulse duration and/or pulse shape. Obviously also suitable combinations of the charging schemes may be used.

Preferably, the battery management system 100 uses the calculated battery temperature for accurately controlling the battery charger 200. It will be appreciated that in a simple embodiment, the battery management system 100 may use a measured battery temperature to control the battery charger 200.

Simulation Results for Constant Current Charging and Discharging

FIGS. 8, 9 and 10 illustrate the simulated charge behaviour of a NiCd battery versus voltage (FIG. 8), pressure (FIG. 9), and temperature (FIG. 10) for constant current charging and discharging. The simulation results were achieved using the described model with parameter values given in the Appendix and a constant ambient temperature of 25° C. The horizontal axis in the figures denotes the applied ($Q_{in}$) or the withdrawn ($Q_{out}$) charge, which is calculated from the product of time and current. It will be appreciated that shapes of the curves shown in the figures with simulation results provide a good match with the real behaviour of a battery.

Figure 8A:
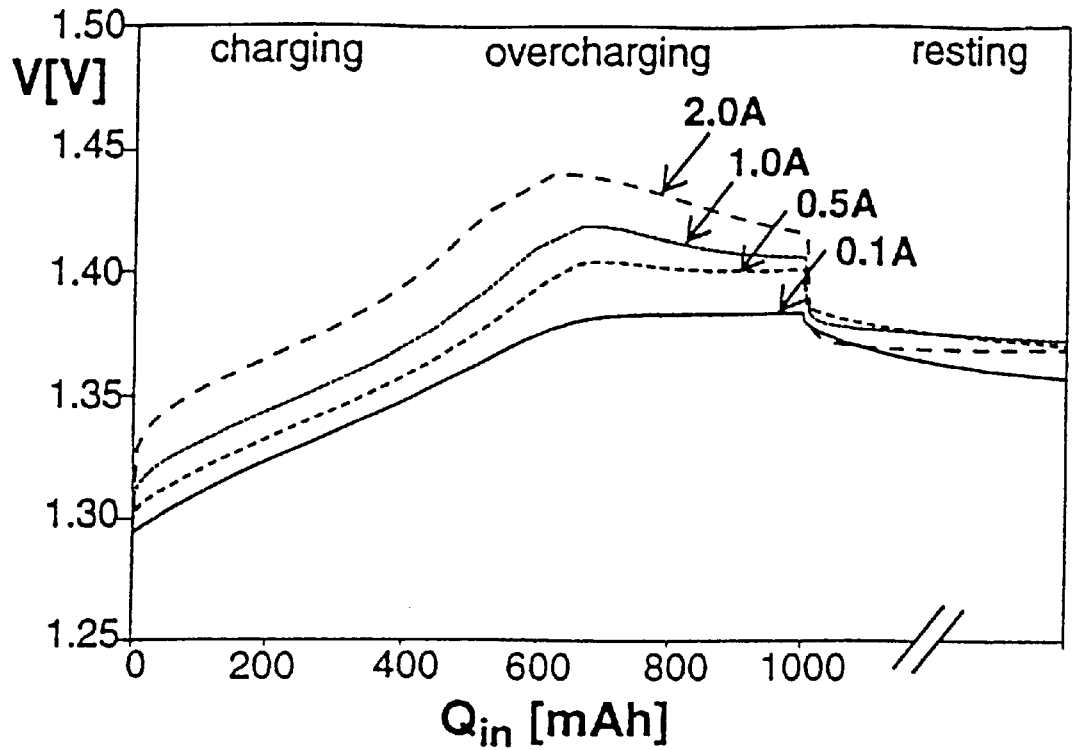
FIG. 8 shows curves of simulated voltage vs. charge behaviour of a NiCd battery as a function of the current.
Figure 8B:
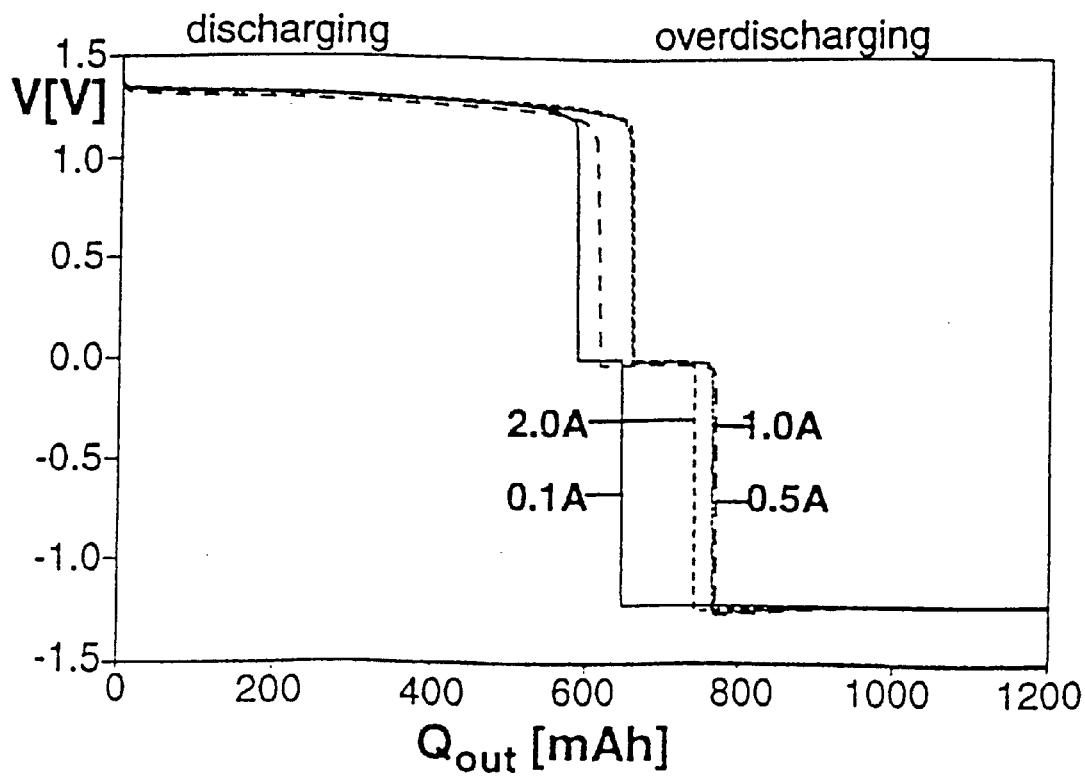
Figure 10A:
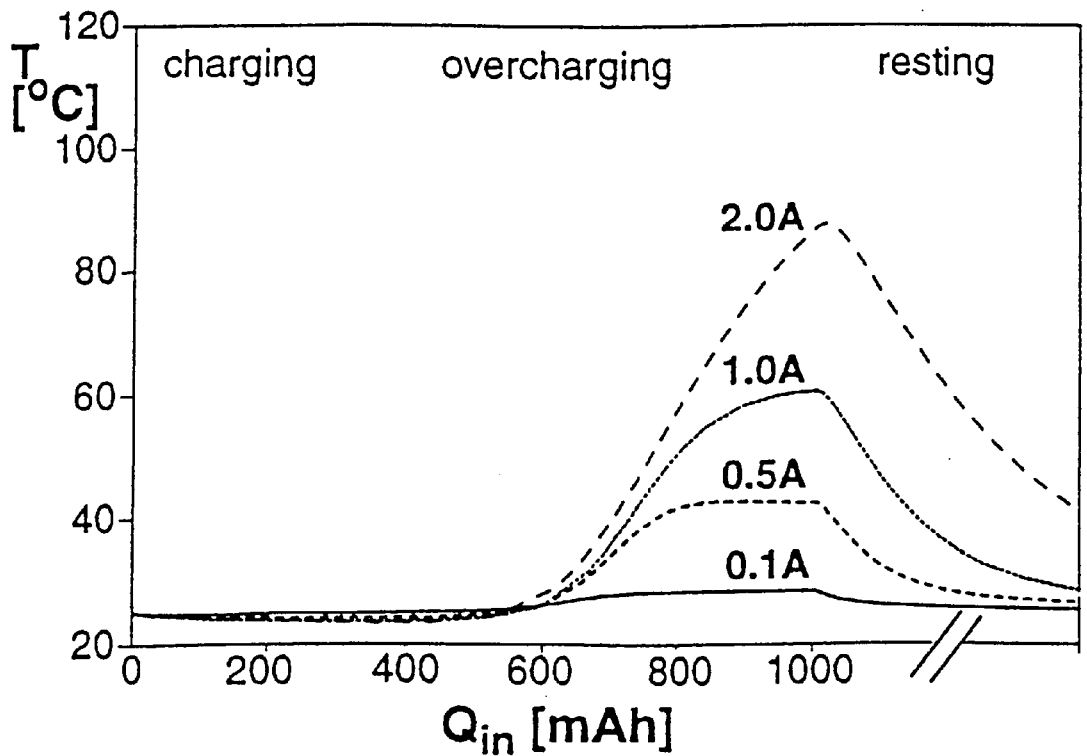
FIG. 10 shows curves of simulated temperature vs. charge behaviour of a NiCd battery as a function of the current.

The influence of the charge/discharge current on the battery voltage during charging and discharging is depicted in FIG. 8a and FIG. 8b, respectively. The battery voltage of the charging curves shown in FIG. 8a stairs at a value of about 1.3 V and then gradually increases. Near the end of charging the voltage rises more steeply and reaches a maximum value, after which, in the overcharging region, a voltage decline can be distinguished, especially for larger currents. This $-\Delta V$ effect is more pronounced at higher currents because in those cases the temperature rise during overcharging is higher, as shown in FIG. 10a. After the current has been interrupted (at $Q_{in}$=1000 mAh) the voltage slowly relaxes to a quasi-steady-state value. However, true equilibrium can never be reached in a NiCd battery, due to the thermodynamic instability of the nickel electrode.

FIG. 8a shows that the battery voltage increases at higher charging currents due to the higher potential drop. This is caused by:

(a) Thz higher charge transfer overpotentials represented by the anti-parallel diodes in FIG. 5a.
(b) The higher diffusion overpotentials, especially for proton diffusion in the nickel electrode as can be calculated from FIG. 6b. Similar diffusion overpotentials apply to Li diffusion in the case of Li-ion batteries.
(c) The higher ohmic potential drop across the ohmic resistances of the electrolyte solution, $R_e$, and the electrodes, $R_{Ni}^s$ and $R_{Cd}^s$ of FIG. 5a.

FIG. 8b shows the battery voltage development during discharging as a function of the discharge current. Again, the battery voltage depends strongly on the applied discharge current. The battery voltage remains relatively constant. However, towards the end of discharging the voltage drops sharply to about 0 V, which is the value of the first plateau associated with overdischarging. In this stage of the discharging process metallic cadmium is oxidized at the cadmium electrode and the overdischarge reserve consisting of $Cd(OH)_2$ in the nickel electrode, is reduced, as also illustrated in FIG. 3.

Figure 9A:
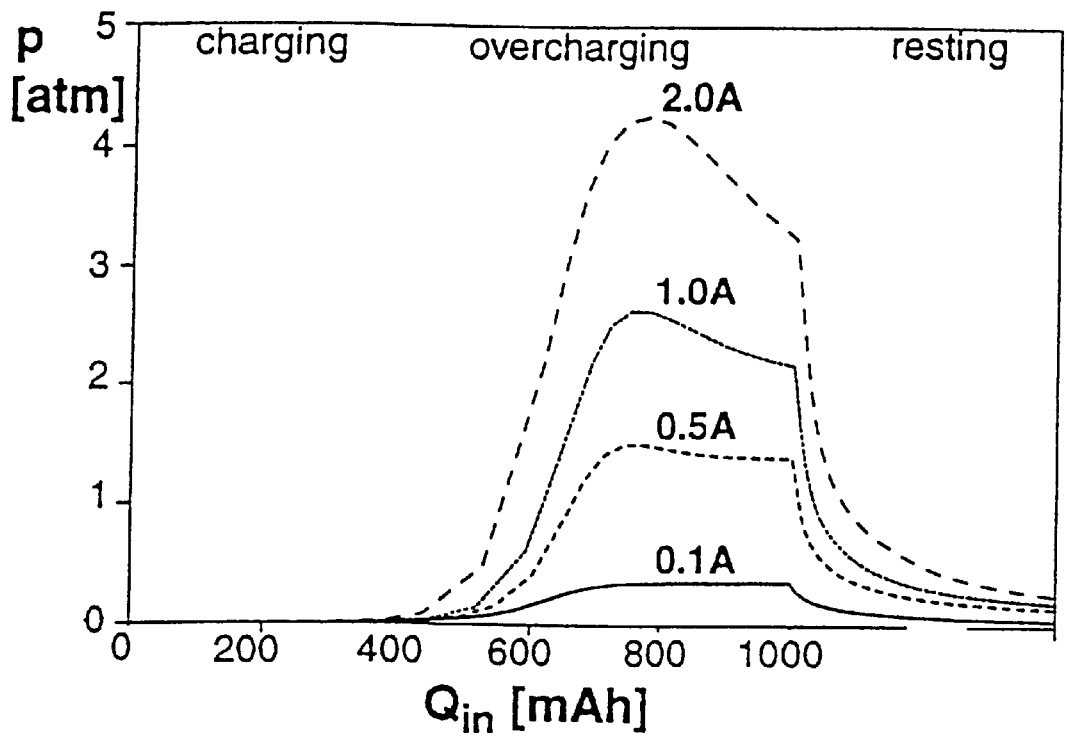
FIG. 9 shows curves of simulated pressure vs. charge behaviour of a NiCd battery as a function of the current.

FIG. 9a shows the corresponding pressure development during charging. For higher currents the pressure rise occurs earlier due to the lower charge efficiency at higher charging currents. During overcharging the pressure levels off to reach a maximum, which is higher for higher currents. The steep temperature rise during overcharging may lead to a situation where, especially for high charging currents, the oxygen recombination reaction rate exceeds the oxygen evolution reaction rate. This causes the pressure during overcharging to decrease again.

The temperature development during charging is shown in FIG. 10a. As is to be expected, the temperature becomes higher at higher currents. The strongest temperature rise occurs when the pressure starts to level off. This is due to the large heat contribution of the oxygen recombination reaction, which occurs at an overpotential of 1.2 V (refer eq. (54)).

Figure 9B:
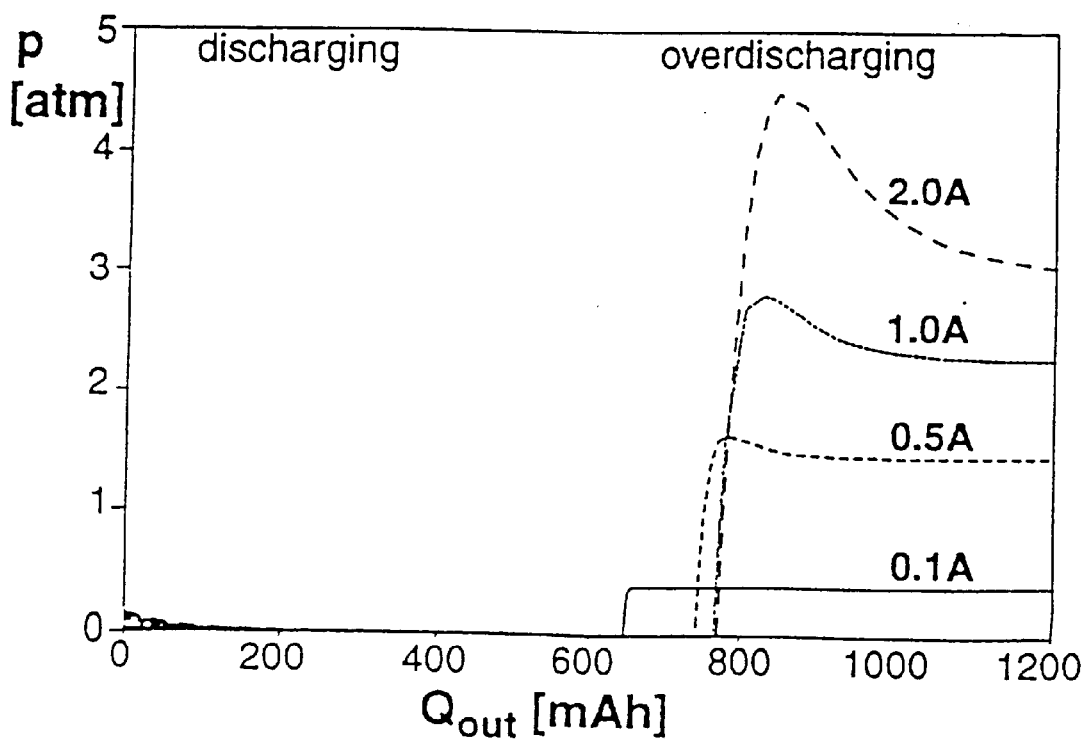
Figure 10B:
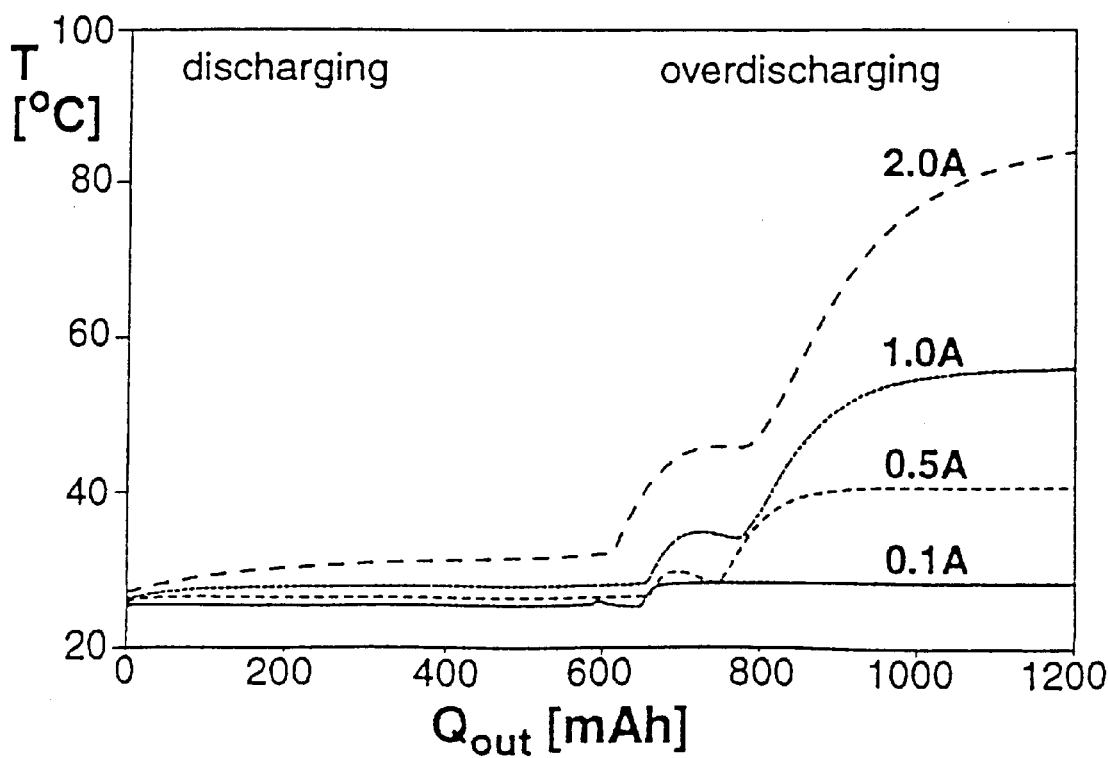

FIGS. 9b and 10b show the pressure and temperature development during discharging, respectively. For lower discharge currents the cell voltage reverses earlier as illustrated in FIG. 8b. Therefore, the pressure rises earlier in FIG. 9b. During overdischarging the pressure reaches a plateau value due to the oxygen recombination reaction taking place at the nickel electrode. Again, at higher discharge currents a pressure decrease can be noticed, caused by the temperature dependence of the oxygen recombination reaction.

Figure 12A:
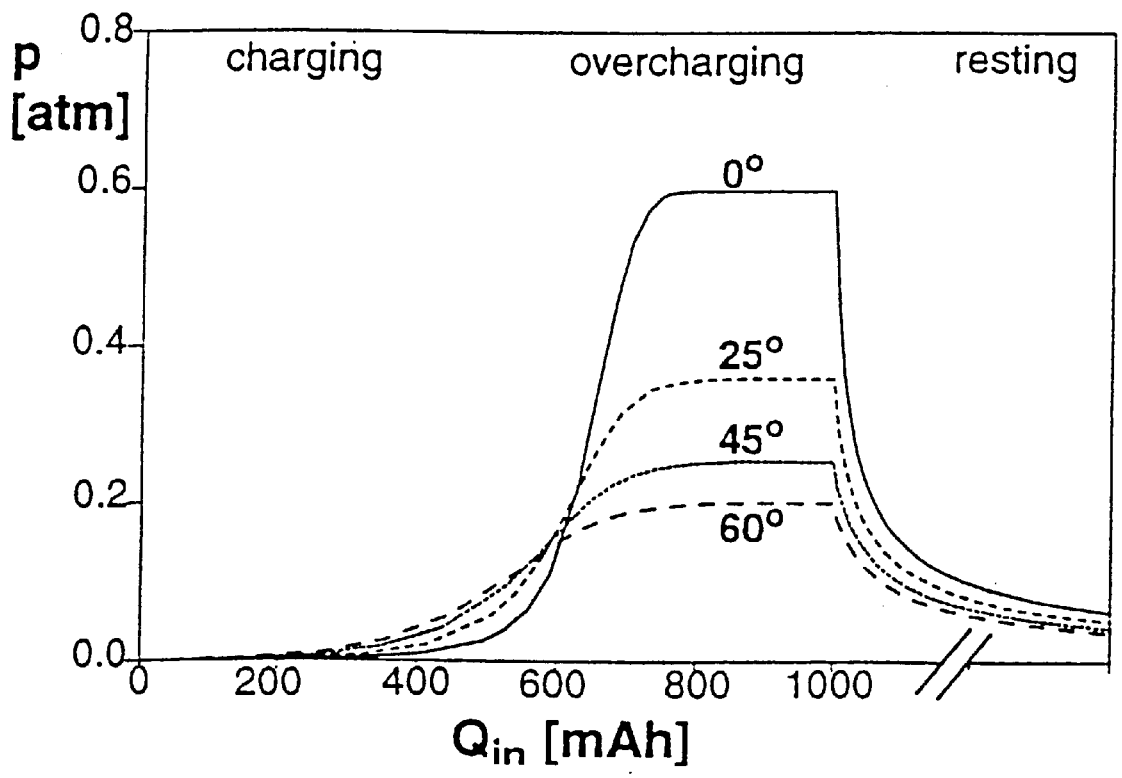
FIG. 12 shows curves of simulated pressure vs. charge behaviour of a NiCd battery as a function of the ambient temperature.
Figure 12B:
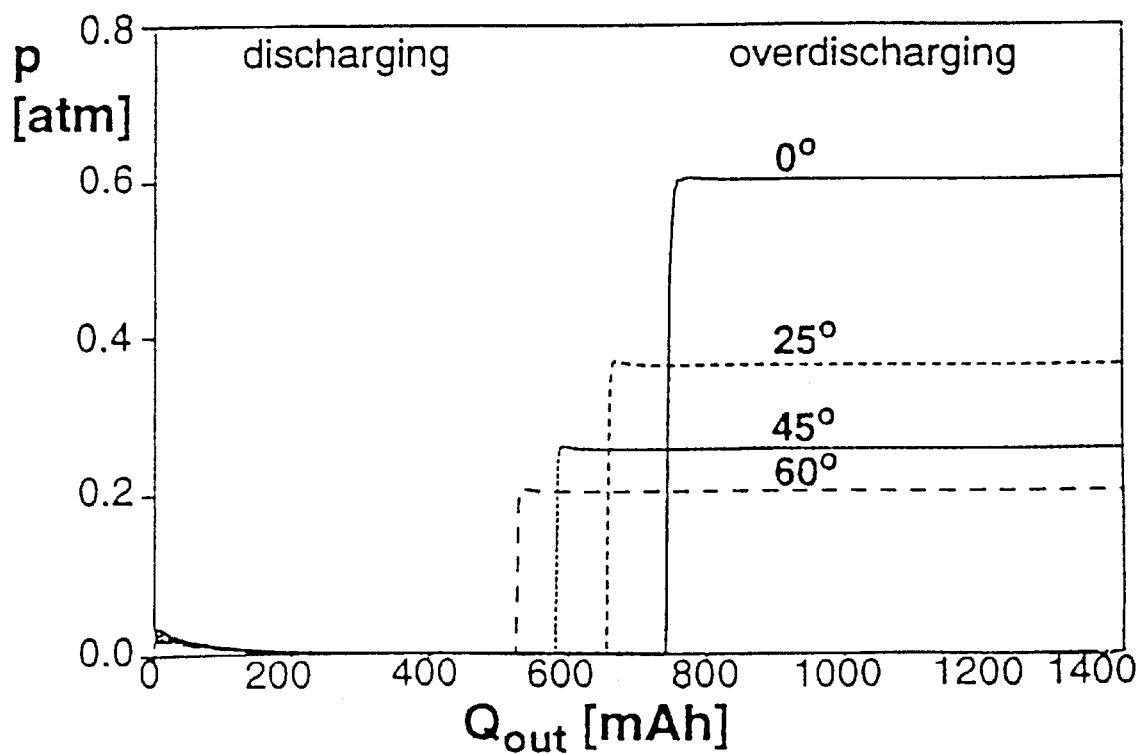
Figure 13A:
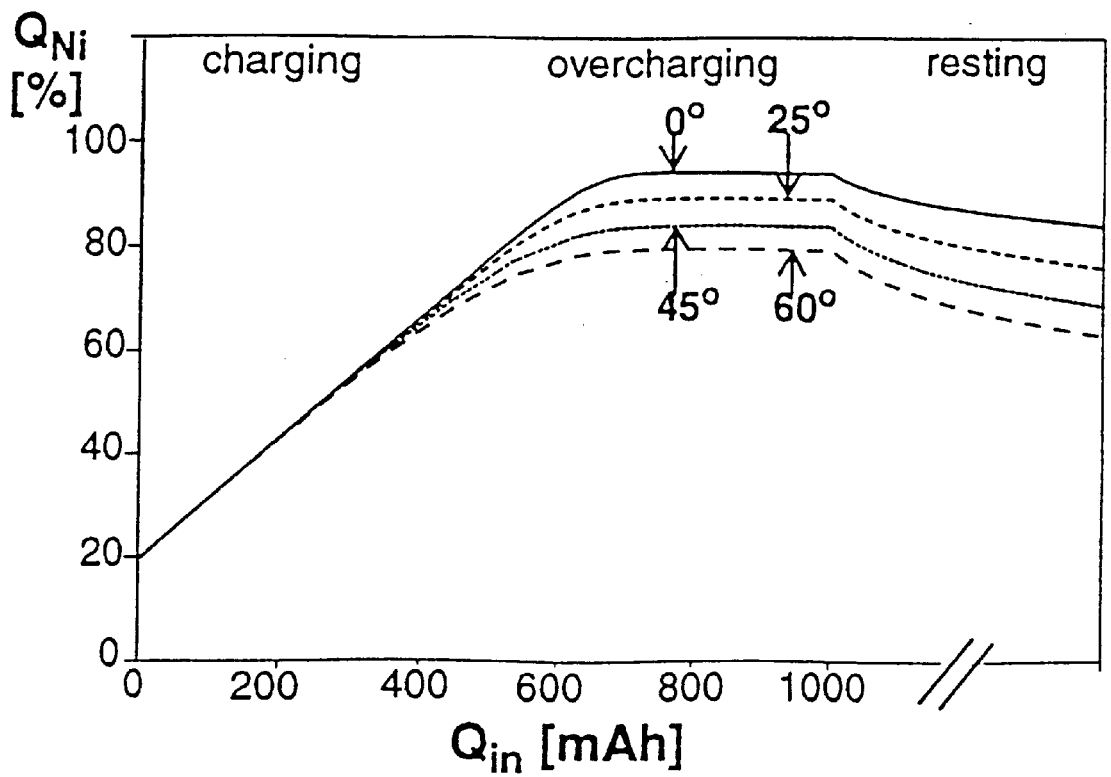
FIG. 13 shows curves of simulated state-of-charge vs. charge behaviour of a NiCd battery as a function of the ambient temperature.
Figure 13B:
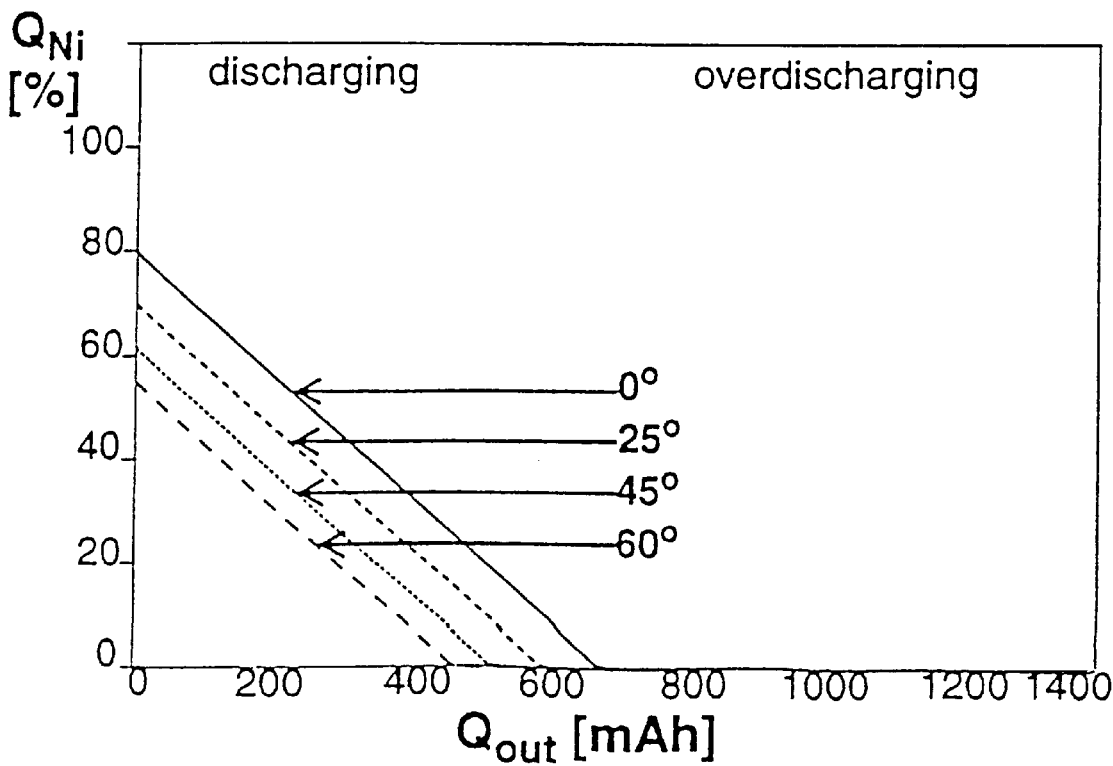

Simulation Results Showing the Influence of the Ambient Temperature on Charging/Discharging Behaviour The ambient temperature has a strong influence on the battery performance, since the temperature is an important parameter which appears in practically all mathematical equations describing the battery related processes. Modelling of the influence of the ambient temperature can be performed with the network of FIG. 7. The ambient temperature can simply be regulated by adjusting the voltage across the capacitor $C_a^{th}$ Due to the coupling between the sub-circuits representing the thermal, electrical, concentration and pressure domains, the influence of the ambient temperature is immediately seen in the simulated battery characteristics. FIGS. 11, 12 and 13 illustrate the simulated charge behaviour of a NiCd battery versus voltage (FIG. 11), pressure (FIG. 12), and state of charge (FIG. 13) as a function of the ambient temperature. The simulation results were achieved using the described model with parameter values given in the Appendix and a charge/discharge current of 0.1 A.

Figure 11A:
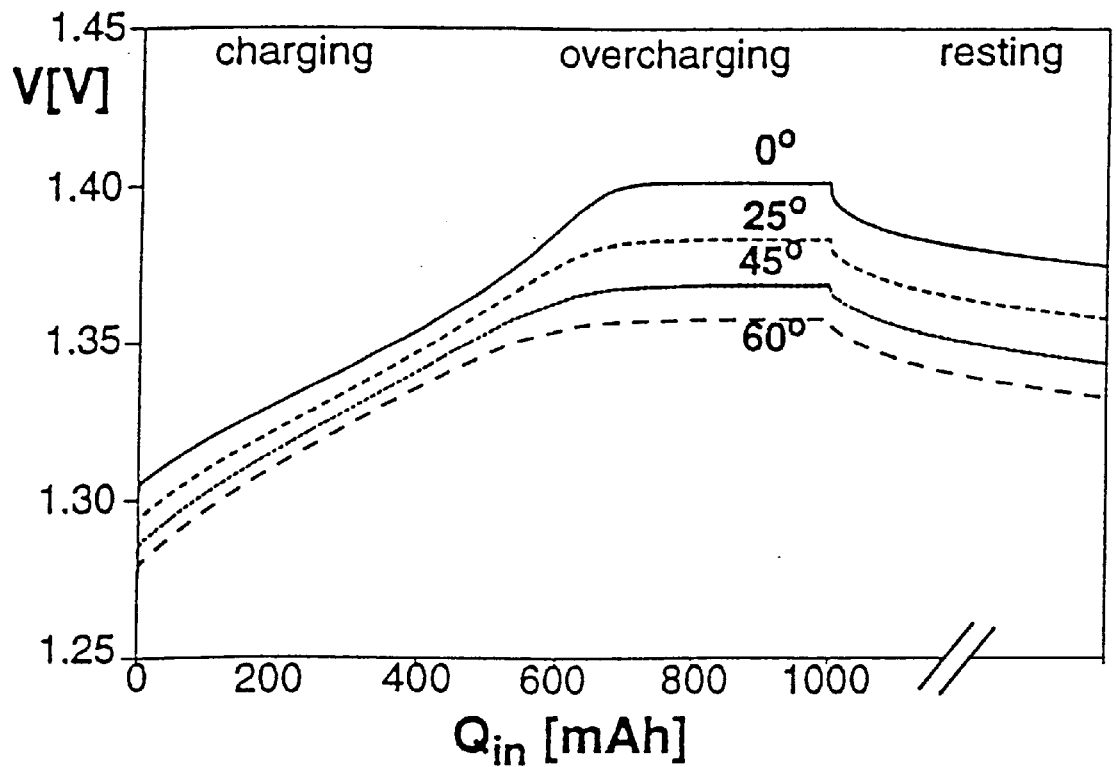
FIG. 11 shows curves of simulated voltage vs. charge behaviour of a NiCd battery as a function of the ambient temperature.
Figure 11B:
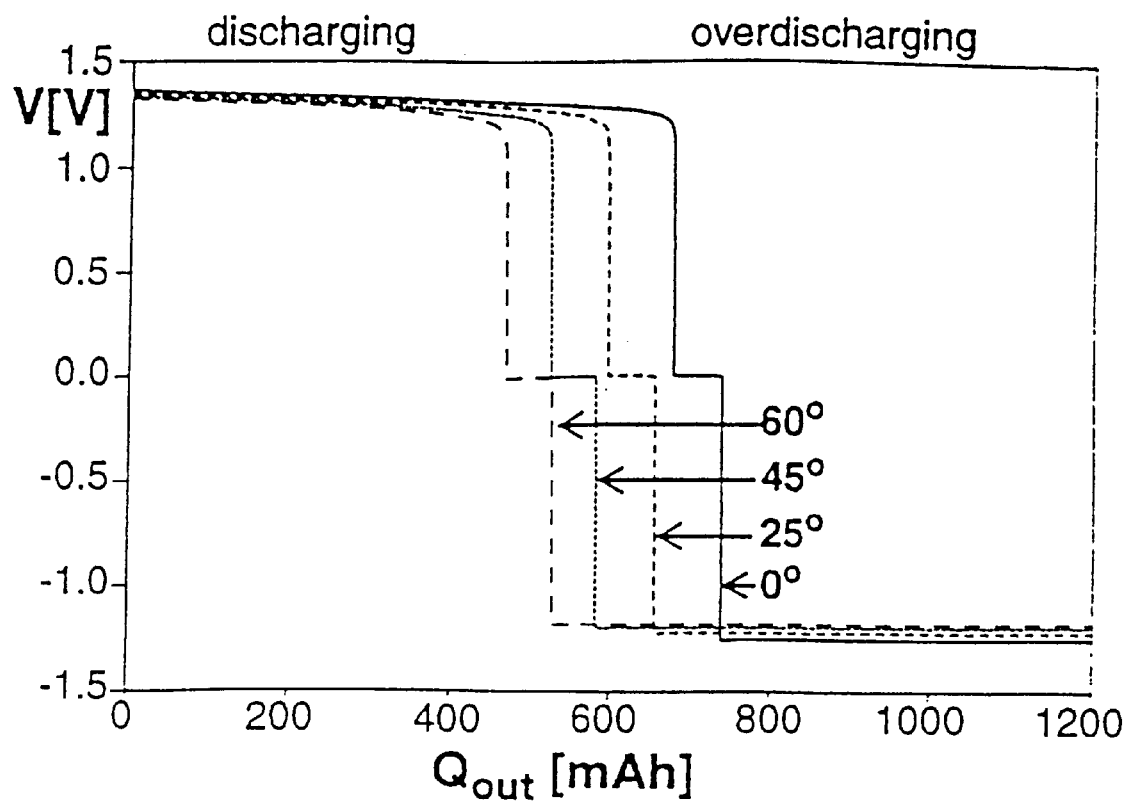

FIG. 11a and 11b show the influence of the ambient temperature on the simulated charge and discharge characteristics. During charging, the battery voltage is lower at higher temperatures. This effect is caused, on the one hand, by decreasing equilibrium potentials (voltage across variable capacitors in FIG. 5a) of both the nickel and cadmium reactions at higher temperatures due to their negative temperature coefficients and, on the other hand, by decreasing reaction overpotentials due to the improved kinetics and mass transport (lower voltage across diodes in FIG. 5a). During overdischarging, however, the temperature behaviour of the battery voltage characteristics reverses as illustrated in FIG. 11b.

FIG. 11a shows that the steep voltage rise disappears at higher temperatures. This is an indication that the charge efficiency decreases at higher temperatures and that the competition between the nickel and oxygen evolution reaction becomes more severe. The lower charge efficiency at elevated temperatures is due to the improved kinetics of the oxygen evolution reaction at high temperatures. This is also shown in FIG. 12a where the cell pressure starts to increase already in an early stage of the charging process at higher temperatures. The pressure plateau value is lower at higher temperatures, however, due to the better oxygen recombination reaction kinetics at higher temperatures. During overdischarging the pressure increases earlier at higher temperatures as shown in FIG. 12b. The reason for this is that, due to the lower charge efficiency, $Q_{Ni}$ before discharging is lower for higher temperatures and therefore the overdischarged state is reached earlier. The development of the battery charges during charging and discharging at different temperatures are shown in FIG. 13a and b, respectively. The lower charge efficiency at higher temperatures during charging is clearly found. During discharging the state-of-charge continues to decrease linearly until the electrode is completely discharged, because during discharging there is less competition between the main and side reactions.

Simulation Results of Selfdischarge Behaviour

Figure 14:
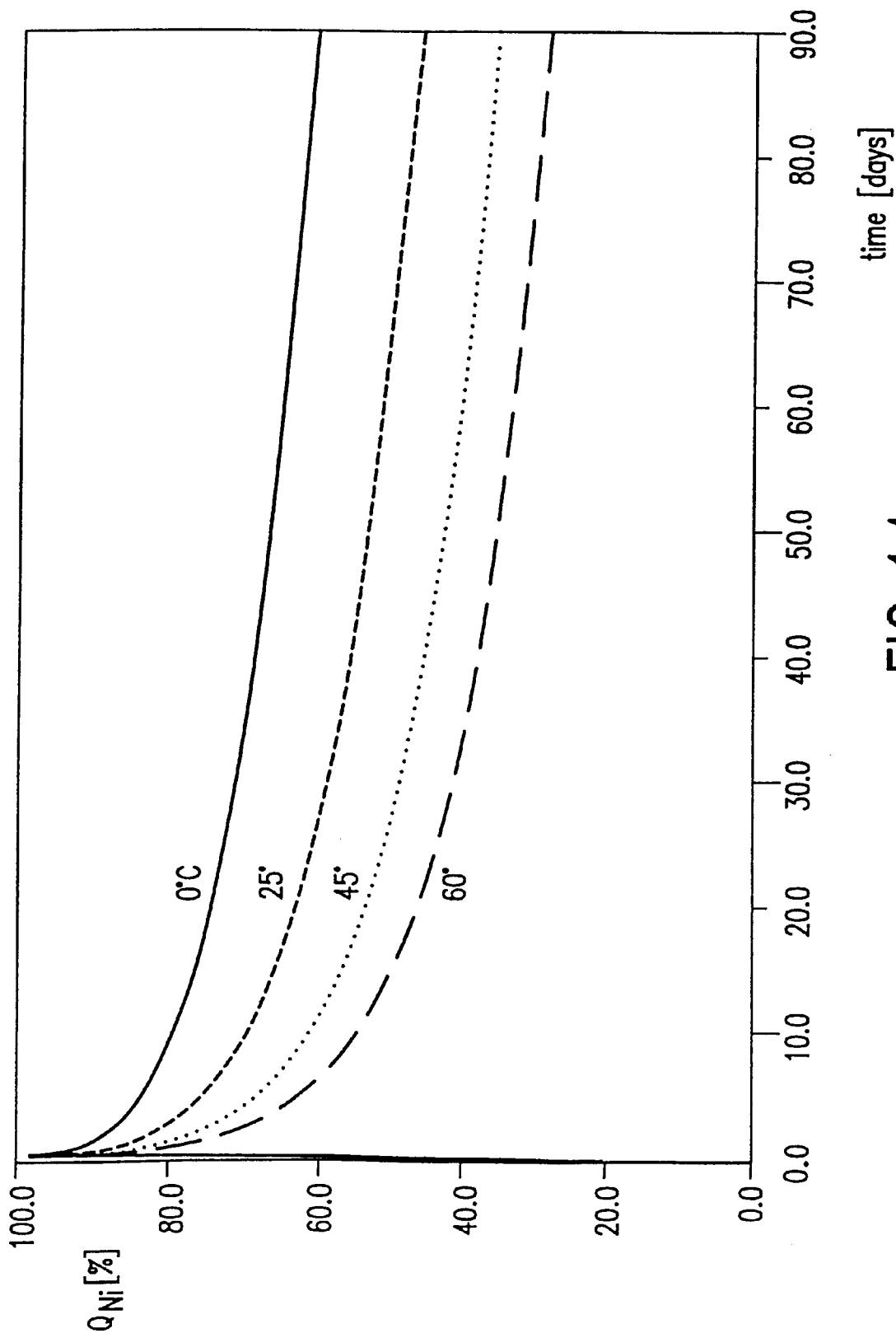
FIG. 14 shows curves of simulated selfdischarge behaviour of a NiCd battery at different ambient temperatures.

When the charge current is interrupted, both the nickel and cadmium electrodes are slowly discharged. The nickel electrode shows selfdischarge behaviour due to its thermodynamic instability with respect to the oxygen evolution reaction, as a result of which the NiOOH species is continuously reduced while the electrolyte species (OH$^-$) is oxidized. The cadmium electrode is selfdischarged as a result of the gaseous oxygen formed at the nickel electrode, which continues to recombine according to eq. (2) and (4). Since at the nickel electrode oxygen is continuously formed, selfdischarge of the cadmium electrode perpetuates. The selfdischarge behaviour is thus the result of two separate loop currents, which can also be recognised in the electronic network of FIG. 5a. The first takes place at the nickel electrode between the nickel and oxygen parallel current paths and the second at the cadmium electrode between the cadmium and the oxygen parallel current paths. Since the nickel electrode determines the state-of-charge of the battery, the selfdischarge rate is determined by the nickel electrode. The simulated selfdischarge behaviour is shown in FIG. 14 at different ambient temperatures. This figure shows that the battery selfdischarges more significant at higher temperatures. This is a result of the improved kinetics of both the oxygen evolution and recombination reaction at higher temperatures.

Appendix
List of parameters used in the NiCd battery model

| parameter | value |
| --- | --- |
| mol weight Ni(OH)$_2$ | 92.71 g/mol |
| mol weight Cd | 112.4 g/mol |
| Maximum Ni electrode capacity | 3060 C |
| Maximum Cd electrode capacity | 5000 C |
| Maximum Cd overdischarge reserve at the Ni electrode | 1000 C |
| Battery void volume | $1.5*10^{-6}$ m$^3$ |
| Electrode geometric surface area | $80*10^{-4}$ m$^2$ |
| Specific surface area of Ni electrode | 4 m$^2$/g |
| Specific surface area of Cd electrode | 4 m$^2$/g |
| Ni electrode thickness | $5.5*10^{-6}$ m |
| Cd electrode pore depth | $1*10^{-5}$ m |
| KOH electrolyte concentration | $8*10^{-3}$ mol/m$^3$ |
| Electrolyte resistance | $10*10^{-3}$ Ω |
| Ni electrode resistance | $2*10^{-3}$ Ω |
| Cd electrode resistance | $2*10^{-3}$ Ω |
| $E_{NiOOH/Ni(OH)2}^{\circ}$ (vs. SHE) | 0.52 V |
| $dE_{NiOOH/Ni(OH)2} / dT$ | $-1.35*10^{-3}$ V/K |
| $E_{Cd/Cd(OH)2}^{\circ}$ (vs. SHE) | $-0.808$ V |
| $dE_{Cd/Cd(OH)2} /dT$ | $-1.06*10^{-3}$ V/K |
| $E_{OH-/O2}^{\circ}$ (vs. SHE) | 0.4011 V |
| $dE_{OH-/O2} /dT$ | $-1.6816*10^{-3}$ V/K |
| Ni electrode double layer capacitance | 0.2 F/m$^2$ |
| Cd electrode double layer capacitance | 0.2 F/m$^2$ |
| Solubility constant of O$_2$ in 8M KOH (T = 298K) | $1.98*10^{-6}$ Pa · m$^3$/mol |
| Solubility constant of Cd(OH)$_2$ (T = 298K) | $2.94*10^{-9}$ m$^3$/mol |
| Exchange current density of Ni charge/discharge reaction (T = 298K, 50% state-of-charge) | $10^{-3}$ A/m$^2$ |
| Activation energy of Ni charge/discharge reaction | $40*10^3$ J/mol |
| Exchange current density of Cd charge/discharge reaction (T = 298K) | 100 A/m$^2$ |
| Activation energy of Cd charge/discharge reaction | $40*10^3$ J/mol |
| Exchange current density of O$_2$ formation at the Ni electrode (T = 298K) | $10^{-8}$ A/m$^2$ |
| Exchange current density of O2 formation/ recombination at the Cd electrode (T = 298K) | $10^{-3}$ A/m$^2$ |
| Exchange current density of O2 recombination at the Ni electrode (T = 298K) | $10^{-4}$ A/m$^2$ |
| Activation energy of O$_2$ formation/recombination reaction | $40*10^3$ J/mol |
| Proton diffusion coefficient in the Ni electrode (T = 298K) | $5*10^{-14}$ m$^2$/s |
| Activation energy of proton diffusion coefficient | $9.62*10^3$ J/mol |
| O$_2$ diffusion coefficient in 8M KOH (T = 298K) | $5*10^{-10}$ m$^2$/s |
| Activation energy of O$_2$ diffusion coefficient | $14*10^3$ J/mol |
| Cadmiate diffusion coefficient in KOH (T = 298K) | $5*10^{-10}$ m$^2$/s |
| Activation energy of Cadmiate diffusion coefficient | $14*10^3$ J/mol |
| Charge transfer coefficient Ni reaction | 0.5 |
| Charge transfer coefficient Cd reaction | 0.5 |
| Charge transfer coefficient O$_2$ reaction | 0.5 |
| Diffusion layer thickness for O$_2$ at both electrodes | $3*10^{-7}$ m |

We claim:

1. A battery management system comprising:
    an input which receives input signals representative of a physical quantity of a battery; and a
    processor which calculates at least one physical quantity of the battery at least partially based on the input signals and a battery temperature, and generates an output signal derived from the calculated physical quantity;
    calculates the physical quantity based on an electrochemical/physical model of the battery; the model including at least one representation of a main electrochemical storage reaction;
    calculates the battery temperature based on a temperature model of a temperature development in the battery and calculates the behaviour of the representation in dependence on the calculated battery temperature; and
    derives the output signal at least partially from a state of the representation.

2. A battery management system as claimed in claim 1, characterised in that the battery temperature is modeled as depending on an internal heat flow generated in the battery, where the internal heat flow depends on at least one of: an entropy change of the main electrochemical storage reaction inside the battery, a power loss through charge transfer resistance in an electrochemical reaction, and power loss through internal ohmic resistance of an electrode and/or electrolyte.

3. A battery management system as claimed in claim 1, characterised in that the input receives a signal representative of an ambient temperature and in that the battery temperature is modeled as depending on an heat flow between the battery and an environment of the battery.

4. A battery management system as claimed in claim 1, characterised in that for a battery having at least one electrode with an overdischarge reserve, the model includes a second representation for an electrochemical side reaction involving the overdischarge reserve; and in that the processor calculates a state of the second representation in dependence on the calculated battery temperature and derives the control signal at least partially from a state of the second representation.

5. A battery management system as claimed in claim 2, characterised in that the battery temperature is modeled as depending on an entropy change of the electrochemical side reaction involving the overdischarge reserve.

6. A battery management system as claimed in claim 1, characterised in that the battery is of a sealed type; in that the model includes a third representation for an electrochemical side reaction involving gas; and in that the process or calculates a state of the third representation in dependence on the calculated battery temperature and derives the output signal at least partially from a state of the third representation.

7. A battery management system as claimed in claim 2, characterised in that the battery temperature is modeled as depending on an entropy change of the electrochemical side reaction involving gas.

8. A battery management system as claimed in claim 6, characterised in that the processor calculates a battery pressure based on a pressure model of a pressure development in the battery for the received input signals and calculates the behaviour of the third representation in dependence on the calculated battery pressure.

9. A battery management system as claimed in claim 1, characterised in that the model includes a fourth representation for modeling ion transport in an electrode and/or electrolyte; and in that the processor calculates a state of the fourth representation and an influence of the fourth representation on the first and/or second representation.

10. A battery management system as claimed in claim 1, wherein the control signal controls a battery charger, characterised in that the processor controls the charging of the battery by maintaining a battery temperature substantially at a predetermined temperature curve.

11. A smart battery comprising:
    a sensor which measures
    at least one physical quantity of the battery;
    a battery management system as claimed in claim 1, wherein the sensor is connected to the input means of the battery management system; and
    an information/control device which presents information with respect to physical quantity of the battery and/or controls charging/discharging of the battery in response to the output signal of the battery management system.

12. A battery charger/discharger comprising:

a sensor which measures at lest one physical quantity of a battery;

a battery management system as claimed in claim 1, wherein the sensor is connected to the input of the battery management system; and a controller which controls charging and/or discharging of the battery in response to the output signal of the battery management system.

13. A battery simulator comprising:

an input for receiving an input value of at least one parameter representative of a physical quantity of a battery; and a processor which calculates at least one characteristic of a physical quantity of the battery at least partially based on the input value and a battery temperature, and which generates an output characteristic derived from the calculated characteristic of the physical quantity;

characterised in that the processor calculates the battery temperature based on a temperature model of a temperature development in the battery;

calculates the characteristic of the physical quantity based on an electrochemical/physical model of the battery; the model including at least one representation of a main electrochemical storage reaction, whose behaviour depends on the calculated battery temperature; and derives the output characteristic at least partially from a state of the representation of the main electrochemical storage reaction.

14. A method for simulating a behaviour of a battery; the method comprising:

receiving an input value of at least one parameter representative of a physical quantity of the battery;

calculating at least one characteristic of a physical quantity of the battery at least partially based on the input value and a battery temperature;

generating an output characteristic derived from the calculated characteristic of the physical quantity;

characterised in that the method comprises:

calculating the battery temperature based on a temperature model of a temperature development in the battery;

calculating the characteristic of the physical quantity based on an electrochemical/physical model of the battery; the model including at least one representation of a main electrochemical storage reaction whose behaviour depends on the calculated battery temperature; and deriving the output characteristic at least partially from a state of the representation of the main electrochemical storage reaction.

15. A method for producing a battery, comprising:

simulating a characteristic of the battery, by iteratively:

selecting a value for at least one parameter representative of a physical quantity of the battery;

calculating at least one characteristic of a physical quantity of the battery at least partially based on the parameter value and a battery temperature, by:

calculating the battery temperature based on a temperature model of a temperature development in the battery; and calculating the characteristic of the physical quantity of the battery based on an electrochemical/physical model of the battery; the model including at least one representation of a main electrochemical storage reaction whose behaviour depends on the calculated battery temperature; the calculated characteristic at least partially being derived from a state of the representation of the main electrochemical storage reaction;

until the calculated characteristic meets a predetermined criterion; and producing the battery from battery materials by selecting and/or adapting a chemical composition and/or physical characteristic of the battery materials according to the parameters values last selected in the iteration.

* * * * *